(12) United States Patent
Kim et al.

(10) Patent No.: US 12,382,784 B2
(45) Date of Patent: Aug. 5, 2025

(54) DISPLAY DEVICE INCLUDING A DAM AND HAVING AN OUTER VIA FACING THE DISPLAY AREA

(71) Applicant: SAMSUNG DISPLAY CO., LTD., Yongin-si (KR)

(72) Inventors: Hyung Bae Kim, Hwaseong-si (KR); Sung Hyun Park, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 621 days.

(21) Appl. No.: 17/658,098

(22) Filed: Apr. 6, 2022

(65) Prior Publication Data

US 2023/0057191 A1 Feb. 23, 2023

(30) Foreign Application Priority Data

Aug. 18, 2021 (KR) ........................ 10-2021-0108730

(51) Int. Cl.
*H10K 50/844* (2023.01)
*H10K 59/122* (2023.01)
(Continued)

(52) U.S. Cl.
CPC ......... *H10K 50/844* (2023.02); *H10K 59/122* (2023.02); *H10K 59/131* (2023.02); *H10K 59/40* (2023.02)

(58) Field of Classification Search
CPC .. H10K 50/844; H10K 50/8445; H10K 59/40; H10K 59/121; H10K 59/122;
(Continued)

(56) References Cited

U.S. PATENT DOCUMENTS

| 9,991,465 B2 | 6/2018 | Jeon |
| 10,431,771 B2 | 10/2019 | Park et al. |

(Continued)

FOREIGN PATENT DOCUMENTS

| KR | 10-2016-0127873 A | 11/2016 |
| KR | 10-2018-0054385 A | 5/2018 |

(Continued)

OTHER PUBLICATIONS

Office Action dated Jan. 15, 2025, in corresponding Korean Patent Application No. 10-2021-0108730, 12 pages.

*Primary Examiner* — Wael M Fahmy
*Assistant Examiner* — Tiberiu Dan Onuta
(74) *Attorney, Agent, or Firm* — F. CHAU & ASSOCIATES, LLC

(57) ABSTRACT

A display device includes a substrate. A thin-film transistor layer includes a transistor disposed on the substrate. A via layer is disposed on the transistor. A light-emitting element layer is disposed on the thin-film transistor layer. The light-emitting element layer Includes a pixel defining layer and a spacer disposed thereon. An encapsulation layer is disposed on the light-emitting element layer. An insulating layer is disposed on the encapsulation layer. A touch line is disposed on the insulating layer. A dam is disposed in a non-display area and surrounds a display area. An outer via is disposed beyond the dam. The outer via and the via layer are on the same layer. The encapsulation layer covers one end of the outer via facing the display area. The insulating layer covers a top surface of a portion of the outer via adjacent to an edge of the encapsulation layer.

13 Claims, 13 Drawing Sheets

(51) Int. Cl.
*H10K 59/131* (2023.01)
*H10K 59/40* (2023.01)

(58) Field of Classification Search
CPC .. H10K 59/123; H10K 59/131; H10K 59/873; H10K 2102/351
See application file for complete search history.

(56) References Cited

U.S. PATENT DOCUMENTS

| | | | |
|---|---|---|---|
| 11,061,505 B2 | 7/2021 | Jang et al. | |
| 11,392,243 B2 | 7/2022 | Jang et al. | |
| 11,809,657 B2 | 11/2023 | Jang et al. | |
| 2016/0315284 A1* | 10/2016 | Jeon | H10K 50/8445 |
| 2018/0138450 A1* | 5/2018 | Park | H10K 59/8731 |
| 2018/0308903 A1 | 10/2018 | Jeong et al. | |
| 2019/0088733 A1* | 3/2019 | Cho | H10K 59/873 |
| 2020/0067017 A1* | 2/2020 | Seo | H10K 77/10 |
| 2021/0365146 A1* | 11/2021 | Kim | G06F 3/0446 |
| 2022/0352485 A1* | 11/2022 | Shin | H10K 59/122 |

FOREIGN PATENT DOCUMENTS

| | | |
|---|---|---|
| KR | 10-2019-0073061 A | 6/2019 |
| KR | 10-2020-0053911 A | 5/2020 |
| KR | 10-2021-0077954 A | 6/2021 |
| KR | 1020210072198 | 6/2021 |

\* cited by examiner

DISPLAY DEVICE INCLUDING A DAM AND HAVING AN OUTER VIA FACING THE DISPLAY AREA

CROSS-REFERENCE TO RELATED APPLICATION

This application claims priority under 35 U.S.C. 119 to Korean Patent Application No. 10-2021-0108730 filed on Aug. 18, 2021 in the Korean Intellectual Property Office, the contents of which is incorporated by reference herein in its entirety.

TECHNICAL FIELD

The present disclosure relates to a display device and, more particularly, to a display device including a dam.

DISCUSSION OF THE RELATED ART

Display devices are being applied to various electronic devices such as smartphones, digital cameras, notebook computers, navigation systems, and smart televisions. The display device may include a flat panel display device such as a liquid crystal display device (LCD), a field emission display device (FED), or an organic light-emitting diode (OLED) display device. The organic light-emitting diode display device includes a light-emitting element in which each pixel of a display panel may self-emit light so that the OLED may display an image without a backlight unit providing light to the display panel.

Recently, a touch sensing unit that senses a touch input has been widely applied as an input unit of a display device in a smart phone or a tablet PC. The touch sensing unit determines whether a touch has occurred, and calculates a position of the touch as input coordinates.

SUMMARY

A display device includes a substrate including a display area and a non-display area. A thin-film transistor layer including a thin-film transistor is disposed on the substrate. A via layer is disposed on the thin-film transistor. A light-emitting element layer is disposed on the thin-film transistor layer. The light-emitting element layer includes a pixel defining layer defining a plurality of light-emitting areas and a spacer disposed on the pixel defining layer. An encapsulation layer is disposed on the light-emitting element layer so as to protect the light-emitting element layer. An insulating layer is disposed on the encapsulation layer. A touch line is disposed on the insulating layer and extends to the non-display area. A first dam is disposed in the non-display area and surrounds the display area. An outer via is disposed outwardly of the first dam. The outer via and the via layer are of the same layer. The encapsulation layer covers one end of the outer via facing toward the display area. The insulating layer covers a top surface of a portion of the outer via adjacent to an edge of the encapsulation layer.

The encapsulation layer may include a first encapsulation layer disposed on the light-emitting element layer, a second encapsulation layer disposed on the first encapsulation layer, and a third encapsulation layer disposed on the second encapsulation layer. The first encapsulation layer may cover one end of the outer via.

The third encapsulation layer may cover an edge of the first encapsulation layer and may cover a top surface of a portion of the outer via adjacent to the edge of the first encapsulation layer.

The thin-film transistor layer may further include a power line disposed on the thin-film transistor. A portion of the power line may be covered with the outer via.

The first encapsulation layer may directly cover an exposed portion of the power line disposed between the first dam and the outer via.

The display device may further include a touch electrode disposed between the third encapsulation layer and the insulating layer. The touch electrode may be connected to the touch line through a contact-hole provided in the insulating layer.

The display device may further include a first capacitor disposed between the touch line and the power line and in an area adjacent to one end of the outer via. A second capacitor may be disposed between the touch line and the power line and in an area overlapping the outer via.

Capacitance of the first capacitor may be inversely proportional to a sum of thicknesses of the first encapsulation layer, the third encapsulation layer, and the insulating layer.

Capacitance of the second capacitor may be inversely proportional to a stun of thicknesses of the outer via, the first encapsulation layer, the third encapsulation layer, and the insulating layer.

The first dam may include a first via layer. The via layer and the first via layer may be of a same layer, a first pixel defining layer covering a top surface and side surfaces of the first via layer. The pixel defining layer and the first pixel defining layer may be of a sane layer and may form a first spacer. The spacer and the first spacer may be of a same layer.

A display device includes a substrate including a display area and a non-display area. A thin-film transistor layer including a thin-film transistor is disposed on the substrate, A via layer is disposed on the thin-film transistor. A light-emitting element layer is disposed on the thin-film transistor layer. The light-emitting element layer includes a pixel defining layer defining a plurality of light-emitting areas. A spacer is disposed on the pixel defining layer. An encapsulation layer is disposed on the light-emitting element layer so as to protect the light-emitting element layer. A first dam is disposed in the non-display area and the first dam surrounds the display area. An outer via is disposed outwardly from the first dam. The outer via and the via layer are of a same layer. An outer encapsulation layer covers one end of the outer via facing toward the display area and covers an edge of the encapsulation layer.

The encapsulation layer may include a first encapsulation layer disposed on the light-emitting element layer, a second encapsulation layer disposed on the first encapsulation layer, and a third encapsulation layer disposed on the second encapsulation layer. An edge of the third encapsulation layer may be spaced apart from one end of the outer via.

The outer encapsulation layer may cover one end of the outer via and the edge of the third encapsulation layer.

The thin-film transistor layer may further include a power line disposed on the thin-film transistor. A portion of the power line may be covered with the outer via.

The outer encapsulation layer may directly cover an exposed portion of the power line disposed between the third encapsulation layer and the outer via.

The display device may further include a touch electrode disposed on the third encapsulation layer, an insulating layer disposed on the touch electrode, and a touch line disposed on the insulating layer and connected to the touch electrode. The touch line may extend to the non-display area.

The display device may further include a first capacitor disposed between the touch line and the power line and in an area adjacent to one end of the outer via, and a second capacitor disposed between the touch line and the power line and in an area overlapping the outer via.

Capacitance of the first capacitor may be inversely proportional to a sum of thicknesses of the outer encapsulation layer and the insulating layer.

Capacitance of the second capacitor ma be inversely proportional to a sum of thicknesses of the outer via, the outer encapsulation layer, and the insulating layer.

A thickness of the outer encapsulation layer may be equal to or greater than a sum of thicknesses of the first encapsulation layer and the third encapsulation layer.

A display device includes a substrate, a plurality of light-emitting elements disposed on the substrate, an encapsulation layer disposed over the plurality of light-emitting elements, an insulating layer disposed over the encapsulation layer, a touch line disposed over the insulating layer, a dam structure disposed on the substrate at least partially surrounding the plurality of light-emitting elements, and a via disposed beyond the dam structure such that the dam structure is disposed between the via and the plurality of light-emitting elements. The encapsulation layer and the insulating layer each at least partially cover the via.

The display device may further include a thin-film transistor disposed on the substrate and a via layer disposed over the thin-film transistor. The via may be disposed within the via layer.

The display device may further include a touch line disposed on the insulating layer.

BRIEF DESCRIPTION OF DRAWINGS

The above and other aspects and features of the present disclosure will become more apparent by describing in detail embodiments thereof with reference to the attached drawings, in which.

DETAILED DESCRIPTIONS

Figure 1:
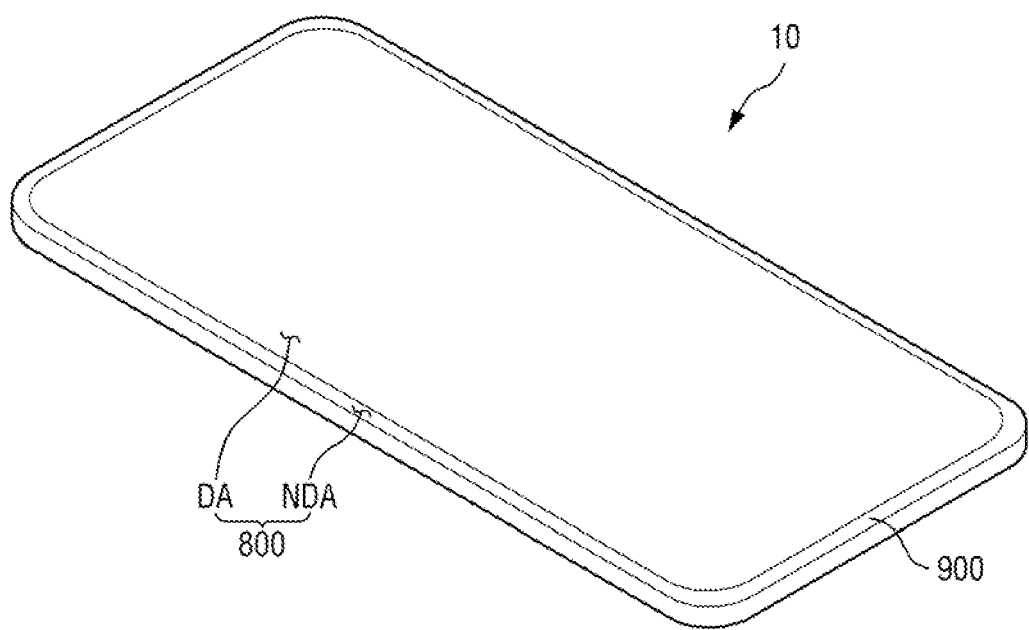
FIG. 1 is a perspective view showing a display device according to an embodiment.

In the following description, for the purposes of explanation, numerous specific details are set forth in order to provide a thorough understanding of various embodiments or implementations of the disclosure. As used herein "embodiments" and "implementations" are interchangeable words that are non-limiting examples of devices or methods employing one or more of the systems, apparatuses, methods, etc. disclosed herein. It is apparent, however, that various embodiments may be practiced without these specific details or with one or more equivalent arrangements. In other instances, well-known structures and devices are shown in block diagram form in order to avoid unnecessarily obscuring various: embodiments. Further, various embodiments may be different from what is set forth herein and implementations of the invention are not necessarily limited to the embodiments set forth herein. For example, specific shapes, configurations, and characteristics of an embodiment may be used or implemented in other embodiments without departing from the disclosure.

Unless otherwise specified, the illustrated embodiments represent one or more ways in which the present invention may be practiced. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Further, in the accompanying drawings, while the shapes, angles, thicknesses, and relative sizes of elements may be exaggerated for clarity and/or descriptive purposes, it should be understood that each figure-, including the shapes, angles, thicknesses and relative sizes of the various illustrated elements does indeed represent at least one specific example of how the invention may be implemented. When an embodiment may be implemented differently, a specific process order may be performed differently from the described order. For example, two consecutively described processes may be performed substantially at the same time or performed in an order opposite to the described order. Also, like reference numerals may denote like elements throughout the specification and the figures.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to" or "directly coupled to" another element or layer, there are no intervening elements or layers present. As used herein, the term "connected" may refer to physical, electrical, and/or fluid connection, with or without intervening elements.

Further, the X-axis, the Y-axis, and the Z-axis are not necessarily limited to three axes of a rectangular coordinate system, and thus the X-, Y-, and Z-axes, and may be interpreted in a broader sense. For example, the X-axis, the Y-axis, and the Z-axis may be perpendicular to one another, or may represent different directions that are not perpendicular to one another.

Although the terms "first," "second," and the like may be used herein to describe various types of elements, these elements should not necessarily be limited by these terms.

These terms are used to distinguish one element from another element, Thus, a first element discussed below could be termed a second element without departing from the teachings of the disclosure.

Spatially relative terms, such as "beneath," "below," "under." "lower," "above," "upper," "over," "higher," "side" (e.g., as in "sidewall" and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented. (e.g., rotated 90 degrees or at other orientations), and, as such, the spatially relative descriptors used herein should be interpreted accordingly.

As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation, not as terms of degree, and thus are utilized to account for inherent deviations in measured, calculated, and/or provided values that would be recognized by one of ordinary skill in the art.

Various embodiments may be described herein with reference to sectional and/or exploded illustrations that are schematic illustrations of idealized embodiments and/or intermediate structures. As such, variations from the shapes of the illustrations as a result, for example, of manufacturing techniques and/or tolerances, may be present. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature, and the shapes of these regions might not reflect actual shapes of regions of a device. However, it is to be understood that none of the above statements should be interpreted as meaning that the figures do not show actual embodiments of the present disclosure and indeed the various shapes, angles, thicknesses, relative sizes, etc. are indeed indented to represent at least one embodiment of the present disclosure and so the geometric relationships illustrated may be taken as disclosing a particular embodiment of the present disclosure. It is just noted that the invention is not necessarily limited to the arrangements shown and variations are to be understood as falling within the scope of the present disclosure.

As customary in the field, some embodiments are described and illustrated in the accompanying drawings in terms of functional blocks, units, parts, and/or modules. Those skilled in the art will appreciate that these blocks, units, parts, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, parts, and/or modules being implemented by microprocessors or other similar hardware, they may be programmed and controlled using software (e.g., microcode) to perform various functions discussed herein and may optionally be driven by firmware and/or software. It is also contemplated that each block, unit, part, and/or module may be implemented by dedicated hardware, or as a combination of dedicated hardware to perform some functions and a processor (e.g., one or more programmed microprocessors and associated circuitry) to perform other functions. Also, each block, unit, part, and/or module of some embodiments may be physically separated into two or more interacting and discrete blocks, units, parts, and/or modules without departing from the scope of the disclosure. Further, the blocks, units, parts, and/or modules of some embodiments may be physically combined into more complex blocks, units, parts, and/or modules without departing from the scope of the disclosure.

Hereinafter, detailed embodiments of the present disclosure will be described with reference to the accompanying drawings.

FIG. 1 is a perspective view showing a display device according to an embodiment of the present disclosure.

Referring to FIG. 1, a display device 10 may be applied to a portable electron device such as a mobile phone, a smart phone, a tablet PC (tablet personal computer), a mobile communication terminal, an electronic notebook, an electronic book, PMP (Portable Multimedia Player), a navigation, UMPC (Ultra Mobile PC), etc. For example, the display device 10 may be applied as a display of a television, a laptop computer, a monitor, a billboard, or an Internet of Things (IoT) device. In an example, the display device 10 may be applied to a wearable device such as a smart watch, a watch phone, a glasses-type display, and a head mounted display (HMD).

The display device 10 may be formed in a planar shape similar to a quadrilateral. For example, the display device 10 may have a planar shape similar to a quadrilateral having a short side extending in an N-axis direction and a long side extending in a Y-axis direction. A corner where the short side extending in the X-axis direction and the long side extending in the Y-axis direction meet each other may be rounded so as to have a predefined curvature or may be formed at a right angle. The planar shape of the display device 10 is not necessarily limited to the quadrilateral, and may include other polygons, a circle, or an ellipse.

The display device 10 may include a cover window 800 and a lower cover 900 (e.g., housing).

The cover window 800 is disposed on a top surface of the display panel so as to cover the top surface of the display panel. The cover window 800 may protect the top surface of the display panel.

The cover window 800 may include a display area DA that displays an image of the display panel and a non-display area NDA disposed around the display area DA. The display area DA may emit light from a plurality of light-emitting areas or a plurality of opening areas of the display panel. The non-display area NDA may be non-transmissive so that unnecessary components other than the image of the display panel are not visible to the user. For example, the cover window 800 may be made of glass, sapphire, or plastic. The disclosure is not necessarily limited thereto. The cover window 800 may be rigid or flexible.

The lower cover 900 may be disposed under the display panel. The lower cover 900 may form an appearance of a lower portion of the display device 10. The lower cover 900 may be formed in a bowl structure to accommodate the display panel therein, Side walls of the lower cover 900 may contact an edge of the cover window 800. In this case, the side walls of the lower cover 900 may be adhered to the edge of the cover window 800 via an adhesive. The lower cover 900 may include plastic or metal. The lower cover 900 may include stainless steel (SUS) or aluminum (Al) to increase heat dissipation effect.

Figure 2:
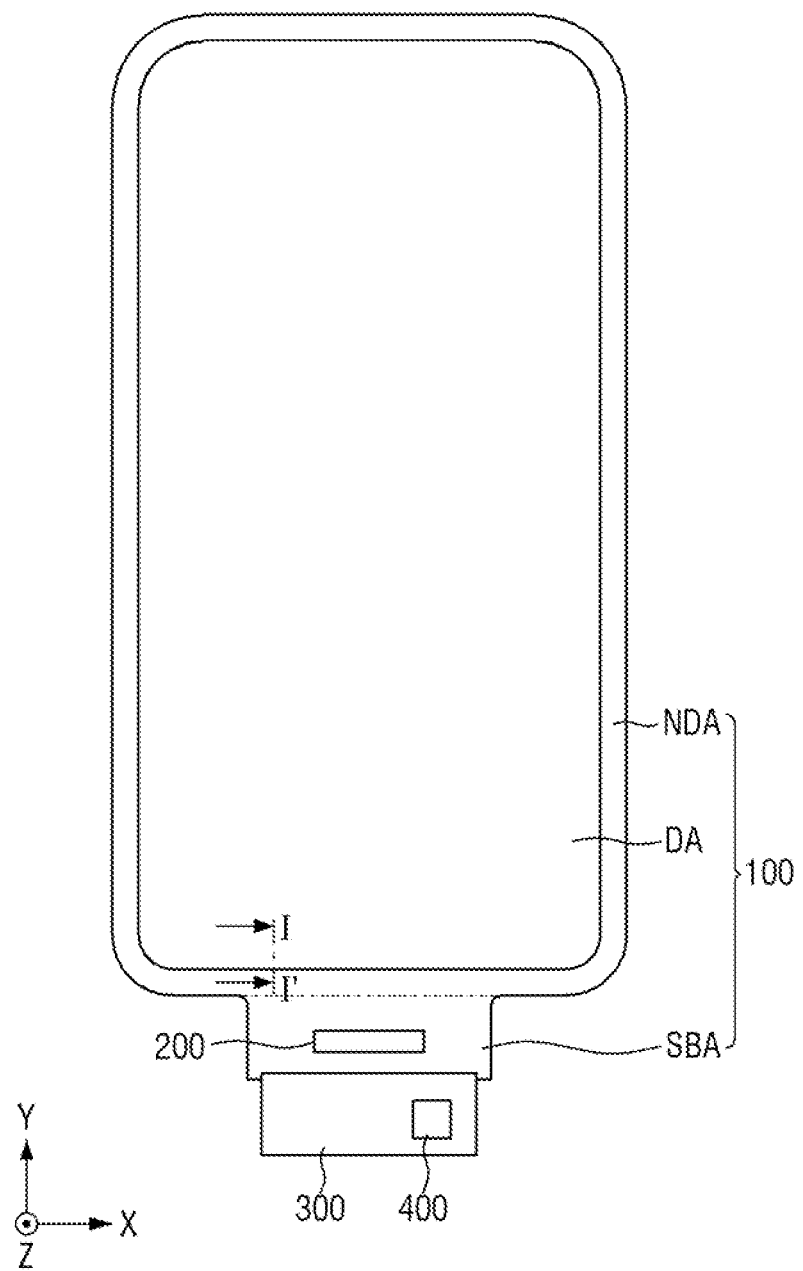
FIG. 2 is a plan view showing a display device according to an embodiment.
Figure 3:
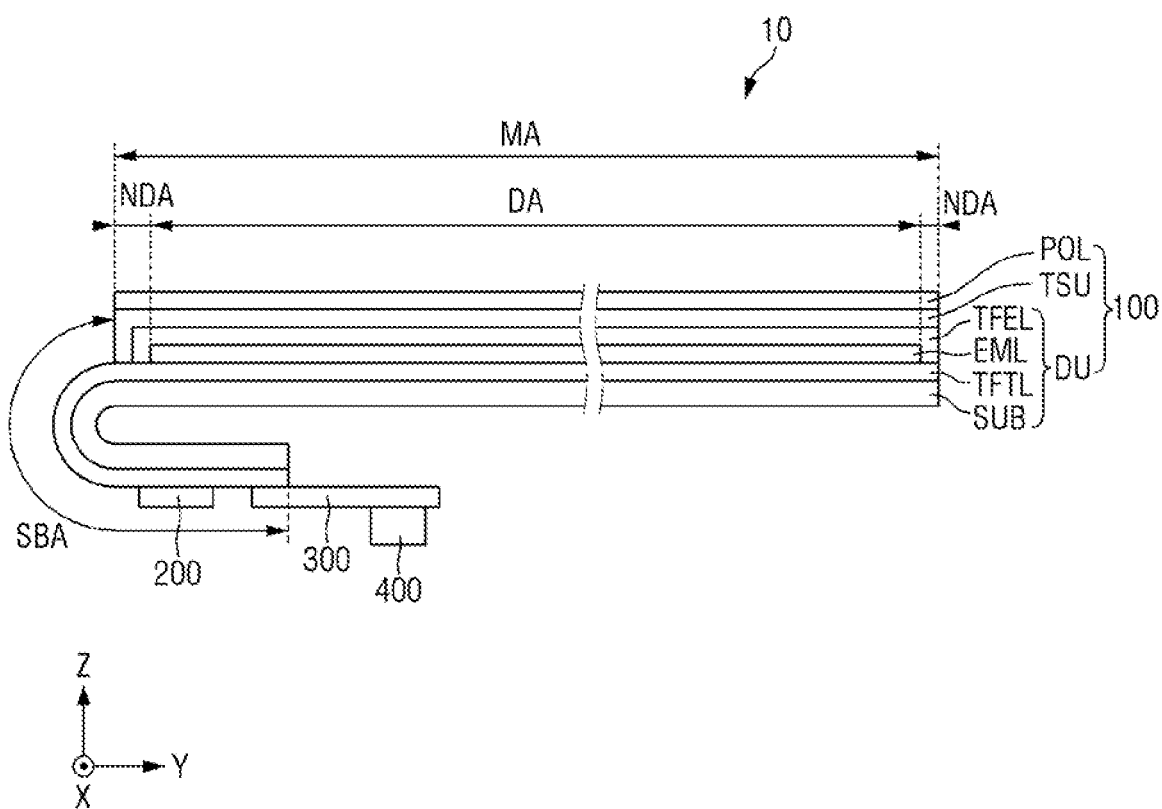
FIG. 3 is a cross-sectional view showing a display device according to an embodiment.

FIG. 2 is a plan view showing a display device according to an embodiment of the present disclosure, and FIG. 3 is a cross-sectional view showing a display device according to an embodiment of the present disclosure.

Referring to FIG. 2 and FIG. 3, a display device 10 may include a display panel 100, a display driver 200, a circuit board 300, and a touch driver 400.

The display panel 100 may include a main area MA and a sub-area SBA.

The main area MA may include a display area DA having pixels for displaying an image, and a non-display area NDA disposed around the display area. DA. The display area DA may emit light from a plurality of light-emitting areas or a plurality of opening areas. For example, the display panel 100 may include a pixel circuit including switching elements, a pixel defining layer defining a light-emitting area or an opening area, and a self-light-emitting element.

For example, the self-light-emitting element may include an organic light-emitting diode including an organic light-emitting layer, a quantum dot light-emitting diode including a quantum dot fight-emitting layer, an inorganic light-emitting diode including an inorganic semiconductor, and/or a micro light-emitting diode (Micro LED). The disclosure is not necessarily limited thereto.

The non-display area NDA may be an area around the display area DA. The non-display area NDA may be defined as an edge area of the main area MA of the display panel 100. The non-display area NDA may include a gate driver that supplies gate signals to gate lines, and fan-out lines that connect the display driver 200 to the display area DA.

The sub-area SBA may extend from one side of the main area MA, The sub-area SBA may include a flexible material and thus may be bendable, foldable, rollable, etc. For example, when the sub-area SBA is bent, the sub-area SBA may overlap the main area MA in a thickness direction of the device (Z-axis direction). The sub-area SBA may include a pad area connected to the display driver 200, and the circuit board 300, Optionally, the sub-area SBA may be omitted, and the display driver 200 and the pad area may be disposed in the non-display area NDA.

The display panel 100 may include a display unit DU, a touch sensing unit TSU, and a polarization film POL. The display unit DU may include a substrate SUB, a thin-film transistor layer TFTL, a light-emitting element layer EML, and an encapsulation layer TFEL.

The substrate SUB may act as a base substrate or a base member. The substrate SUB may be embodied as a flexible substrate that may be bent, folded, rolled, etc. For example, the substrate SUB may include an insulating material such as a polymer resin such as polyimide (PI). The disclosure is not necessarily limited thereto. In an example, the substrate SUB may include a glass material or a metal material.

The thin-film transistor layer TFTL may be disposed on the substrate SUB. The thin-film transistor layer TFTL may include a plurality of thin-film transistors constituting a pixel circuit of pixels. The thin-film transistor layer TFTL may further include gate lines, data lines, power lines, gate control lines, fan-out lines connecting the display driver 200 to the data lines, and lead lines connecting the display driver 200 to the pad area, Each of the thin-film transistors may include a semiconductor area, a source electrode, a drain electrode, and a gate electrode. For example, when the gate driver is formed at one side of the non-display area NDA of the display panel 100, the gate driver may include the thin-film transistors.

The thin-film transistor layer TFTL may be disposed in the display area DA, The non-display area NDA, and the sub-area SBA. The thin-film transistors, the gate lines, the data lines, and the power lines of the pixels of the thin-fil transistor layer TFTL may be disposed in the display area DA. The gate control lines and the fan-out lines of the thin-film transistor layer TFTL may be disposed in the non-display area NDA. The lead lines of the thin-film transistor layer TFTL may be disposed in the sub-area SBA.

The light-emitting element layer EML may be disposed on the thin-film transistor layer TFTL, The light-emitting element layer EML may include a plurality of light-emitting elements in which pixel electrodes, a light-emitting laver, and a common electrode are sequentially stacked to emit light, and a pixel defining layer defining the pixels. The plurality of light-emitting elements of the light-emitting element layer EML may be disposed in the display area DA.

For example, the light-emitting layer may be embodied as an organic light-emitting layer including an organic material. The light-emitting layer may include a hole transporting layer, an organic light-emitting layer, and an electron transporting layer. When the pixel electrode receives a predefined voltage via the thin-film transistor of the thin-film transistor layer TFTL, and the common electrode receives a common voltage, holes and electrons may travel through the hole transport layer and electron transport layer, respectively and then may move to the organic light-emitting layer where the holes and electrons may be combined with each other to emit light. For example, the pixel electrode may act as an anode electrode, and the common electrode may act as a cathode electrode. The disclosure is not necessarily limited thereto.

In an example, each of the plurality of light-emitting elements may include a quantum dot light-emitting diode including a quantum dot light-emitting layer, an inorganic light-emitting diode including an inorganic semiconductor, or a micro light-emitting diode.

The encapsulation layer TFEL may cover a top surface and side surfaces of the light-emitting element layer EML, and may protect the light-emitting element layer EML. The encapsulation layer TFEL may include at least one inorganic film and at least one organic film for encapsulating the light-emitting element layer EML.

The touch sensing unit TSU may be disposed on the encapsulation layer TFEL The touch sensing unit TSU may include a plurality of touch electrodes for sensing a user's touch in a capacitance manner, and touch lines connecting the plurality of touch electrodes to the touch driver 400. For example, the touch sensing unit TSU may sense a user's touch in a mutual capacitance manner or a self-capacitance manner.

In an example, the touch sensing unit TSU may be disposed on a separate substrate disposed on the display unit DU. In this case, the substrate supporting the touch sensing unit TSU may be embodied as a base member encapsulating the display unit DU.

The plurality of touch electrodes of the touch sensing unit TSU may be disposed in a touch sensor area overlapping the display area DA. The touch lines of the touch sensing unit TSU may be disposed in a touch surrounding area overlapping the non-display area NDA.

The polarization film POL may be disposed on the touch sensing unit TSU, The polarization fil POL may be attached onto the touch sensing unit TSU using an optically clear adhesive (OCA) film, or an optically clear resin (OCR). For example, the polarization film POL may include a linear polarizer and a phase retardation film such as a λ/4 plate (quarter-wave plate). The phase retardation film and the linear polarizer may be sequentially stacked on the touch sensing unit TSU.

The display driver 200 may output signals and voltages for driving the display panel 100. The display driver 200 may supply data voltages to the data lines. The display driver 200 may supply power voltage to the power line and may supply the gate control signal to the gate driver. The display driver 200 may be embodied as an integrated circuit (IC) and may be mounted on the display panel 100 using a COG (Chip on Glass) scheme, a COP (Chip on Plastic) scheme, or an ultrasonic bonding scheme. For example, the display driver 200 may be disposed in the sub-area SBA. When the sub-area SBA is bent, the display driver 200 may overlap the main area MA in the thickness direction of the device (in the Z-axis direction), In an example, the display driver 200 may be mounted on the circuit board 300.

The circuit board 300 may be attached onto the pad area of the display panel 100 using an anisotropic conductive film (ACF). The lead lines of the circuit board 300 may be electrically connected to the pad area of the display panel 100. The circuit board 300 may be embodied as a flexible film such as a flexible printed circuit board, a printed circuit board, or COF (Chip on Film).

The touch driver 400 may be mounted on the circuit board 300. The touch driver 400 may be connected to the touch sensing unit TSU of the display panel 100. The touch driver 400 may supply a drive signal to the plurality of touch electrodes of the touch sensing unit TSU and sense change in capacitance between the plurality of touch electrodes. For example, the drive signal may be embodied as a pulse signal with a predefined frequency. The touch driver 400 may determine whether a touch input is made and calculate coordinates of the touch input, based on a change amount in the capacitance between the plurality of touch electrodes. The touch driver 400 may be embodied as an integrated circuit (IC).

Figure 4:
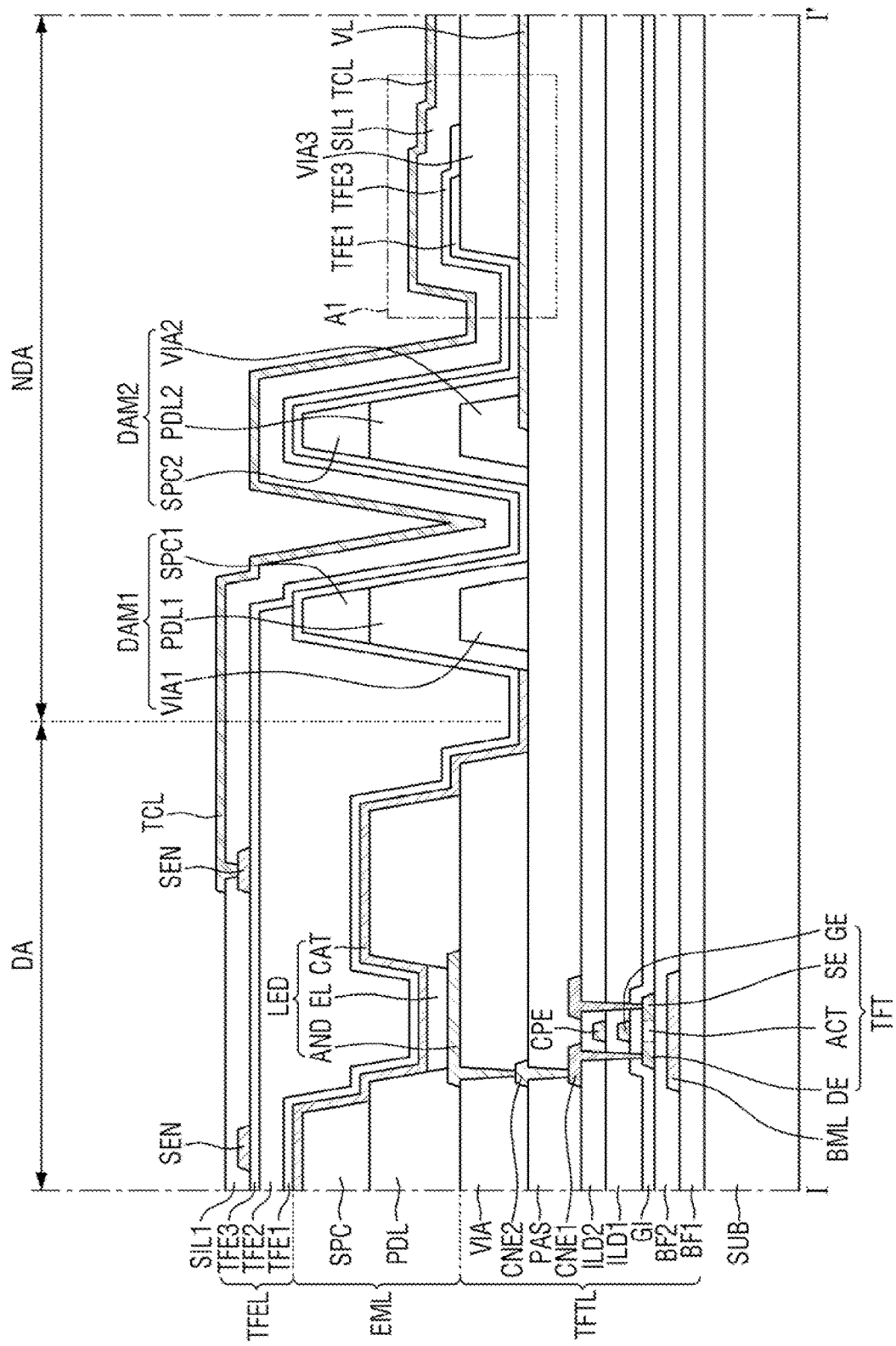
FIG. 4 is a cross-sectional view of an example taken along a line I-J in FIG. 2.
Figure 5:
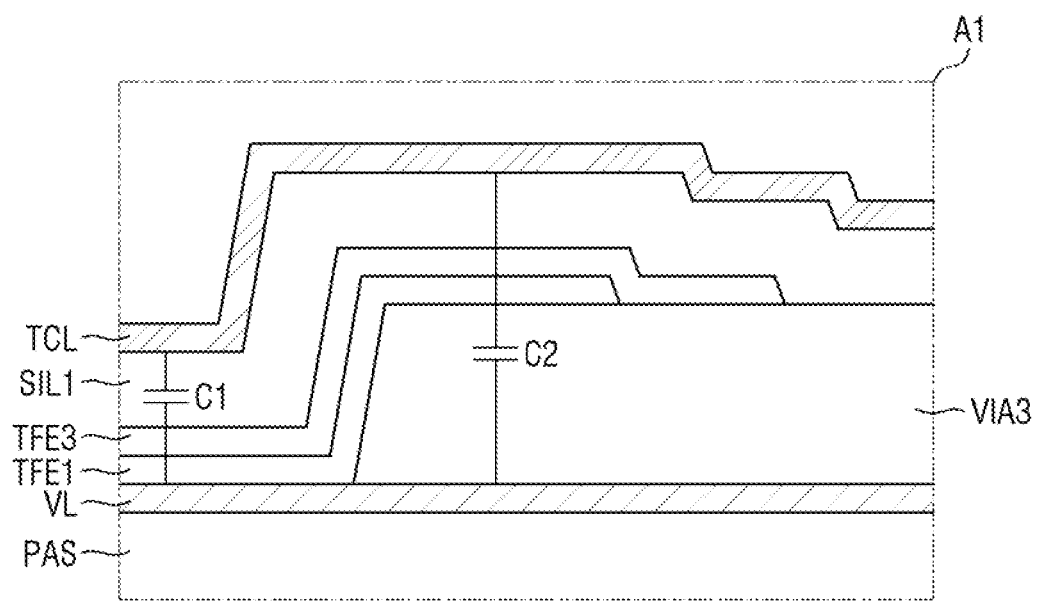
FIG. 5 is an enlarged view showing an area A1 of FIG. 4.

FIG. 4 is a cross-sectional view of an example cut along a line I-I' in FIG. 2, and FIG. 5 is an enlarged view showing an area A1 in FIG. 4.

Referring to FIG. 4 and FIG. 5, the display unit DU may include the substrate SUB, the thin-film transistor layer TFTL, the light-emitting element layer EML, and the encapsulation layer TFEL.

The substrate SUB may act as a base substrate or a base member. For example, the substrate SUB may be embodied as a flexible substrate capable of bending, folding, rolling, and the like. The substrate SUB may include an insulating material such as a polymer resin such as polyimide (PI). In an example, the substrate SUB may be a rigid substrate. The substrate SUB may include, but is not necessarily limited to, a glass material or a metal material.

The thin-film transistor layer TFTL may include a first buffer layer BF1, a light-blocking layer BML, a second buffer layer BF2, a thin-film transistor TFT, a gate insulating layer GL, a first interlayer insulating layer ILD1, a capacitor electrode CPE, a second interlayer insulating layer ILD2, a first connection electrode CNE1, a protective layer PAS, a second connection electrode CNE2, a power line VL, and a via layer VIA.

The first buffer layer BI may be disposed on the substrate SUB. The first buffer layer BF1 may include an inorganic film that may prevent penetration of air or moisture thereto. For example, the first buffer layer BF1 may include a plurality of inorganic films that are alternately stacked.

The light-blocking layer BML may be disposed on it e first buffer layer BF1. For example, the light-blocking layer BML may be composed of a single layer or multiple layers made of one of molybdenum (Mo), aluminum (Al), chromium (Cr), gold (Au), titanium (Ti), nickel (Ni), neodymium (Nd), and copper (Cu) or an alloy thereof. In an example, the light-blocking layer BML may include an organic layer including black pigment.

The second buffer layer BF2 may be disposed on the first buffer layer BF1 and the light-blocking layer BML. The second buffer layer BF2 may include an inorganic film that may prevent penetration of air or moisture thereto. For example, the second buffer layer BF2 may include a plurality of inorganic films that are alternately stacked.

The thin-film transistor TFT may be disposed on the second buffer layer BF2, and may constitute a pixel circuit of each of the plurality of pixels. For example, the thin-film transistor TFT may act as a driving transistor or a switching transistor of the pixel circuit. The thin-film transistor ITT may include a semiconductor area ACT, a source electrode SE, a drain electrode DE, and a gate electrode GE.

The semiconductor area ACT, the source electrode SE, and the drain electrode DE may be disposed on the second buffer layer BF2. The semiconductor area ACT, the source electrode SE, and the drain electrode DE may overlap the light-blocking layer BML in the thickness direction of the device. The semiconductor area ACT may overlap the gate electrode GE in the thickness direction and may be insulated from the gate electrode GE via the gate insulating layer GI. The source electrode SE and the drain electrode DE may be formed by making a material of the semiconductor area ACT conductive.

The gate electrode GE may be disposed on the gate insulating layer GI. The gate electrode GE may overlap the semiconductor area ACT while the gate insulating layer GI is interposed therebetween.

The gate insulating layer GI may be disposed on the semiconductor area ACT, the source electrode SE, and the drain electrode DE. For example, the gate insulating layer GI may cover the semiconductor area ACT, the source electrode SE, the drain electrode DE, and the second buffer layer BF2, and may insulate the semiconductor area ACT and the gate electrode GE from each other. The gate insulating layer GI may have a contact-hole defined therein through which the first connection electrode CNE1 extends.

The first interlayer insulating layer ILD1 may be disposed on the gate electrode GE and the gate insulating layer GIL The first interlayer insulating layer ILD1 may have a contact-hole defined therein through which the first connection electrode CNE1 extends.

The contact-hole of the first interlayer insulating layer ILD1 may be connected to the contact-hole of the gate insulating layer GI and a contact-hole of the second interlayer insulating layer ILD2.

The capacitor electrode CPE may be disposed on the first interlayer insulating layer ILD1. The capacitor electrode CPE may overlap the gate electrode GE in the thickness direction. A capacitance may be generated between the capacitor electrode CPE and the gate electrode GE.

The second interlayer insulating layer ILD2 may be disposed on the capacitor electrode CPE and the first interlayer insulating layer ILD1, The second interlayer insulating layer ILD2 may have the contact-hole defined therein through which the first connection electrode CNE1 extends. The contact-hole of the second interlayer insulating layer ILD2 may be connected to the contact-hole of the first interlayer insulating layer ILD1 and the contact-hole of the gate insulating layer GI.

The first connection electrode CNE1 may be disposed on the second interlayer insulating layer ILD2. The first connection electrode CNE1 may connect the drain electrode DE of the thin-film transistor TFT to the second connection electrode CNE2. The first connection electrode CNE1 may be inserted into the contact-holes respectively defined in the second interlayer insulating layer ILD2, the first interlayer insulating layer ILD1, and the gate insulating layer GI and thus may be in contact with the drain electrode DE of the thin-film transistor TFT.

The protective layer PAS may be disposed on the first connection electrode CNE1 and the second interlayer insulating layer ILD2. The protective layer PAS may protect the thin-film transistor TFT. The protective layer PAS may planarize a portion above the thin-film transistor TFT. The protective layer PAS may have a contact-hole defined therein through which the second connection electrode CNE2 extends. The protective layer PAS may include, but is not necessarily limited to, an organic insulating layer.

The second connection electrode CNE2 may be disposed on the protective layer PAS. The second connection electrode CNE2 may connect the pixel electrode AND of the light-emitting element LED to the first connection electrode CNE1. The second connection electrode CNE2 may be inserted into the contact-hole defined in the protective layer PAS and thus may contact the first connection electrode CNE1.

The power line VL may be disposed on the protective layer PAS. The power line VL and the second connection electrode CNE2 may be made of the same material and may constitute the same layer. The disclosure is not necessarily limited thereto. The power line VL may extend from the non-display area NDA to the display area DA. The power line VL may supply the power voltage received from the display driver 200 or the pad area to the plurality of pixels. In this connection, the power voltage may be a drive voltage, an initialization voltage, a reference voltage, and/or a common voltage. In FIG. 4, the power line VL is shown by way of example. However, the data line may be disposed in place of the power line VL.

The via layer VIA may be disposed on the second connection electrode CNE2, the power line VL, and the protective layer PAS. The via layer VIA may have a contact-hole defined therein through which the pixel electrode AND extends. For example, the via layer VIA may be embodied as an organic insulating layer including a general general-purpose polymer (PMMA, PS), a polymer derivative having a phenolic group, an acryl-based polymer, an imide-based polymer, an arylether-based polymer, an amide-based polymer, a fluorine-based polymer, a p-xylene-based polymer, and/or a vinyl alcohol-based polymer. In an example, the via layer VIA may include an inorganic insulating layer.

The light-emitting element layer EML may be disposed on the thin-film transistor layer TFTL. The light-emitting element layer EML may include a light-emitting element LED, a pixel defining layer PDL, and a spacer SPC. The light-emitting element LED may include the pixel electrode AND, a light-emitting layer EL, and a common electrode CAT.

The pixel electrode AND may be disposed on the via layer VIA. The pixel electrode AND may overlap the light-emitting area or the opening area defined by the pixel defining layer PDL. The pixel electrode AND may be connected to the drain electrode DE of the thin-film transistor TFT via the first and the second connection electrodes CNE1 and CNE2. For example, the pixel electrode AND may include silver (Ag), copper (Cu), aluminum (Al), nickel (Ni), and/or lanthanum (La), In an example, the pixel electrode AND may include a material such as ITO (Indium Tin Oxide), IZO (Indium Zinc Oxide), ITZO (Indium Tin Zinc Oxide), and the like.

The light-emitting layer EL may be disposed on the pixel electrode AND. For example, the light-emitting layer EL may be embodied as an organic light-emitting layer made of an organic material. The disclosure is not necessarily limited thereto. When the light-emitting layer EL is embodied as the organic light-emitting layer, the thin-film transistor TFT applies a predefined voltage to the pixel electrode AND of the light-emitting element LED, and the common electrode CAT of the light-emitting element LED receives the common voltage or a cathode voltage, holes and electrons may move to the light-emitting layer EL through the hole transport layer and the electron transport layer, respectively. Then, the holes and electrons may combine with each other in the light-emitting layer EL to emit light.

The common electrode CAT may be disposed on the light-emitting layer EL, the pixel defining layer PDL, and the spacer SPC. For example, the common electrode CAT may be implemented in a form of an electrode common to all pixels while the common electrode CAT is not divided into a plurality of portions corresponding to the plurality of pixels, respectively. The common electrode CAT may be disposed on the light-emitting layer EL and in the light-emitting area and may be disposed on the pixel defining layer PDL or the spacer SPC and in the areas other than the light-emitting area. The common electrode CAT may receive the common voltage or a low potential voltage. When the pixel electrode AND receives a voltage corresponding to the data voltage and the common electrode CAT receives the low potential voltage, a difference between a voltage of the pixel electrode AND and the voltage of the common electrode CAT may occur, so that the light-emitting layer EL may emit light.

The pixel defining layer PDL may define the plurality of light-emitting areas or the plurality of opening areas. The pixel defining layer PDL may space and insulate the plurality of pixel electrodes AND from each other. The pixel defining layer PDL may include, but is not necessarily limited to, an organic insulating material such as polyimide (PI).

The spacer SPC may be disposed on the pixel defining layer PDL The spacer SPC may protrude from a top surface of the pixel defining layer PDL toward the encapsulation layer TFEL. The spacer SPC may be formed on a partial area of the pixel defining layer PDL in a plan view. The spacer SPC may maintain a spacing between the pixel electrode AND and a metal mask during formation of the light-emitting layer EL, thereby preventing a defect in the light-emitting layer EL. The spacer SPC may reduce an impact transmitted to the plurality of pixels and increase durability of the plurality of pixels. The spacer SPC may include, but is not necessarily limited to, an organic insulating material such as polyimide (PI).

The non-display area NDA may include a first dam DAM1, a second dam DAM2, and an outer via VIA3.

The first dam DAM1 may be disposed in the non-display area NDA so as to surround the display area DA. The first dam DAM1 may include a first via layer VIA1, a first pixel defining layer PDL1, and a first spacer SPC1. The first via layer VIA1 and the via layer VIA may be made of the same material and may constitute the same layer. The first via layer VIA1 may be spaced, by a predefined distance, from the via layer VIA of the display area DA. The first pixel defining layer PDL1 and the pixel defining layer PDL may be made of the same material and may constitute the same layer. The first pixel defining layer PDL1 may cover a top surface and side surfaces of the first via layer VIA1. The first spacer SPC1 and the spacer SPC may be made of the same material and may constitute the same layer. The first spacer SPC1 may be disposed on the first pixel defining layer PDL so as to cover a top surface of the first pixel defining layer PDL1. Each of the first via layer VIA1 of the first dam DAM1, the first pixel defining layer PDL1, and the first spacer SPC1 may have a predefined vertical dimension, thereby preventing a second encapsulation layer TFE2 from extending to an edge of the non-display area NDA.

The second dam DAM2 may be disposed in the non-display area NDA so as to surround the first dam DAM1. The second dam DAM2 may have the same vertical dimension as that of the first dam DAM1. The disclosure is not necessarily limited thereto. The second dam DAM2 may include a second via layer VIA2, a second pixel defining layer PDL2, and a second spacer SPC2. The second via layer VIA2 and the via layer VIA may be made of the same material and may constitute the same layer. The second via layer VIA2 may be spaced, by a predefined distance, from the first via layer VIA1 of the first dam DAM1. The second pixel defining layer PDL2 and the pixel defining layer PDL may be made of the same material and may constitute the same layer. The second pixel defining layer PDL2 may cover a top surface and side surfaces of the second via layer VIA2. The second spacer SPC2 and the spacer SPC may be made of the same material and may constitute the same layer. The second spacer SPC2 may be disposed on the second pixel defining layer PDL2 so as to cover a top surface of the second pixel defining layer PDL2. Each of the second via layer VIA2, the second pixel defining layer PDL2, and the second spacer SPC2 of the second dam DAM2 have a predefined vertical dimension, thereby preventing the second encapsulation layer TFE2 from extending to the edge of the non-display area NDA.

The outer via VIA3 may be disposed at an edge of the non-display area NDA. The outer via VIA3 and the via layer VIA may be made of the same material and may constitute the same layer. The outer via VIA3 may be spaced apart from the second dam DAM2 by a predetermined distance. The outer via VIA3 may cover a portion of the power line VL extending along the non-display area NDA.

The encapsulation layer TFEL may be disposed on the common electrode CAT so as to cover a plurality of light-emitting elements LED. The encapsulation layer FEEL may include first to third encapsulation layers TFE1, TFE2, and TFE3.

The first encapsulation layer TFEL may be disposed on the common electrode CAT so as to cover the plurality of light-emitting elements LED. The first encapsulation layer TFEL may be disposed in the display area DA and a portion of the non-display area NDA surrounding the display area DA in a plan view. The first encapsulation layer TFE1 may be disposed on the first dam DAM1, the second dam DAM2, and the outer via VIA3 disposed in the non-display area NDA. The first encapsulation layer TFE1 may cover a top surface and side surfaces of each of the first dam DAM1 and the second dam DAM2 and may cover one end of the outer via VIA3 facing toward the display area DA, Accordingly, due to the first encapsulation layer TFE1 the touch sensing unit TSU might not directly contact one end of the outer via VIA3. The first encapsulation layer TFE1 may directly cover an exposed portion of the power line VL disposed between the second dam DAM2 and the outer via VIA3 in the non-display area NDA. For example, the outer via VIA3 may be disposed adjacent to the second dam DAM2, so that the first encapsulation layer TFE1 may cover one end of the outer via VIA3. In an example, the first encapsulation layer TFE1 may extend to cover one end of the outer via VIA3, The first encapsulation layer TFE1 may include an inorganic film, thereby preventing oxygen or moisture from penetrating into the light-emitting element layer EML.

The second encapsulation layer TFE2 may be disposed on the first encapsulation layer TFE1. The second encapsulation layer TFE2 may be disposed in the display area DA and a portion of the non-display area NDA surrounding the display area DA in a plan view. The second encapsulation layer TFE2 may planarize a top of the display area DA. Due to the first dam DAM1 or the second dam DAM2, the second encapsulation layer TFE2 might not extend to the edge of the non-display area NDA. The second encapsulation layer TFE2 may include an organic film, thereby protecting the light-emitting element layer EML from a foreign material such as dusts.

The third encapsulation layer TFE3 may be disposed on the first and the second encapsulation layers TFE1 and TFE2. The third encapsulation layer TFE3 may be disposed in the display area DA and a portion of the non-display area NDA surrounding the display area DA in a plan view. The third encapsulation layer TFE3 may be disposed on the second encapsulation layer TFE2 and in the display area DA and may be disposed on the first encapsulation layer TFE1 and in the non-display area NDA. The third encapsulation layer TFE3 may cover an edge of the first encapsulation layer TFE1 covering one end of the outer via VIA3, and a top surface of the outer via VIA3 adjacent to an edge of the first encapsulation layer TFE1. The third encapsulation layer TFE3 may include an inorganic film, thereby preventing oxygen or moisture from penetrating into the light-emitting element layer EML.

When a metal foreign material is present at one end of the outer via VIA3 during formation of the pixel electrode AND, the first and third encapsulation layers TFE1 and TFE3 may cover the metal foreign material. Accordingly, the display device 10 may include the first encapsulation layer-TFE1 covering one end of the outer via VIA3 and the third encapsulation layer TFE3 covering the edge of the first encapsulation layer TFE1, thereby preventing a touch line TCL from being damaged by the metal foreign material which may occur in a process of forming the pixel electrode AND.

The touch sensing unit TSU may be disposed on the display unit DU. The touch sensing unit TSU may include a touch electrode SEN a first insulating layer SIL1, and the touch line TCL.

The touch electrode SEN may be disposed on the encapsulation layer TFEL. The touch electrode SEN may be embodied as a transparent electrode including a transparent conductive material. The touch electrode SEN may transmit light therethrough. The touch electrode SEN may include a driving electrode and a sensing electrode. The touch electrode SEN may be composed of a single layer made of molybdenum (Mo), titanium (Ti), copper (Cu), aluminum (Al), ITO (indium tin oxide), or a stack structure of aluminum and titanium (Ti/Al/Ti), a stack structure of aluminum and ITO (ITO/Al/ITO), an APC alloy, and a stack structure of APC alloy and ITO (ITO/APC/ITO).

The first insulating layer SIL1 may be disposed on the touch electrode SEN. The first insulating layer SIL1 may have insulating and optical functions. For example, the first insulating layer SIL1 may be embodied as an inorganic film including a silicon nitride layer, a silicon oxynitride layer, a silicon oxide layer, a titanium oxide layer, and/or an aluminum oxide layer.

The touch line TCL may be disposed on the first insulating layer SIL1. The touch line TCL may be connected to the touch electrode SEN via a contact-hole received in the first insulating layer SIL1 The touch line TCL may be connected to the touch pad area via the non-display area NDA. Accordingly, the touch line TCL may electrically connect the touch electrode SEN to the touch driver 400.

In FIG. 5, the display device 10 includes the first encapsulation layer TFE1 covering one end of the outer via VIA3 and the third encapsulation layer TFE3 covering the edge of the first encapsulation layer TFE1 such that a spacing between the touch line TCL and the power line VL may increase. A first capacitor C1 may be formed between the touch line TCL and the power line VL and in an area adjacent to one end of the outer via VIA3. Capacitance of the first capacitor C1 may be inversely proportional to a sum of thicknesses of the first and third encapsulation layers TFE1 and TFE3, and the First insulating layer SIL1 The capacitance of the first capacitor C1 may decrease as the distance between the touch line TCL and the power line VL increases. A second capacitor C2 may be formed between the touch line TCL and the power line VL and in an area overlapping the outer via VIA3. Capacitance of the second capacitor C2 may be inversely proportional to a sum of thicknesses of the outer via VIA3, the first and third encapsulation layers TFE1, TFE3, and the first insulating layer SIL1 Therefore, the capacitance of the first capacitor C1 in the display device 10 may be smaller than that in a case where the first and third encapsulation layers TFE1 and TFE3 do not cover one end of the outer via. VIA3, thereby reducing a ratio of the capacitances of the first capacitor C1 and the second capacitor C2. The display device 10 prevents an abrupt change in the capacitance between the touch line TCL and the power line VL, thereby preventing electrostatic discharge of the display device 10 and a short-circuit fault between the lines.

Figure 6:
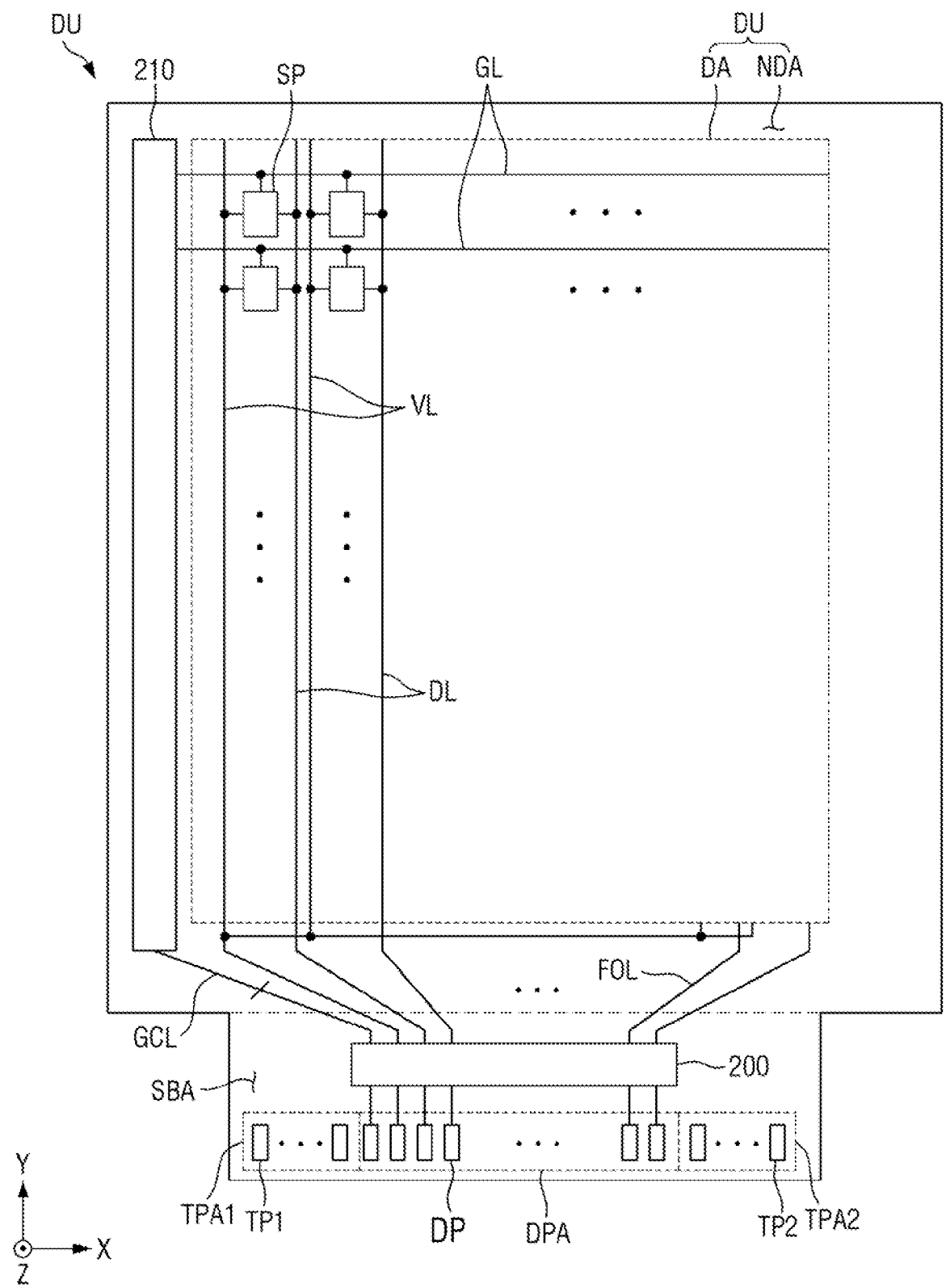
FIG. 6 is an plan view showing a display unit of a display device according to an embodiment.

FIG. 6 is a plan view showing a display unit of a display device according to an embodiment of the present disclosure.

Referring to FIG. 6, a display unit DU may include a display area DA and a non-display area NDA.

The display area DA may be an area for displaying an image and may be defined as an inner area of the display panel 100. The display area DA may include a plurality of pixels SP, a plurality of gate lines CL, a plurality of data lines DL, and a plurality of power lines VL. Each of the plurality of pixels SP may be defined as a minimum unit for outputting light.

The plurality of gate lines GL may supply a gate signal received from a gate driver 210 to the plurality of pixels SP. The plurality of gate lines GL may extend in an X-axis direction and may be spaced apart from each other in a. Y-axis direction intersecting the X-axis direction.

The plurality of data lines DL may supply a data voltage received from a display driver 200 to the plurality of pixels SP. The plurality of data lines DL may extend in the Y-axis direction and may be spaced apart from each other in the X-axis direction.

The plurality of power lines VL may supply a power voltage received front the display driver 200 to the plurality of pixels SP. In this connection, the power voltage may be a drive voltage, an initialization voltage, a reference voltage, and/or a common voltage. The plurality of power lines VL may extend in the Y-axis direction and may be spaced apart from each other in the X-axis direction.

The non-display area NDA may surround the display area DA. The non-display area NDA may include a gate driver 210, fan-out lines FOL, and gate control lines GCL. The gate driver 210 may generate a plurality of gate signals based on a gate control signal and may sequentially supply the plurality of gate signals to the plurality of gate lines GL according to a set order.

The fan-out lines FOL may extend from the display driver 200 to the display area DA. The fan-out lines FOL may supply the data voltage received from the display driver 200 to the plurality of data lines D.

The gate control line GCL may extend from the display driver 200 to the gate driver 210. The gate control line GCL may supply the gate control signal received from the display driver 200 to the gate driver 210.

The sub-area SBA may include the display driver 200, a display pad area DPA, and first and second touch pad areas TPA1 and TPA2.

The display driver 200 may output signals and voltages for driving the display panel 100 to the fan-out lines FOL The display driver 200 may supply the data voltage to the data line DL via the fan-out lines FOL, The data voltage may be supplied to a plurality of pixels SP. Thus, luminance of the plurality of pixels SP may be determined based on the data voltage. The display driver 200 may supply a gate control signal to the gate driver 210 via the gate control line GC.

The display pad area DPA, the first touch pad area TPA1, and the second touch pad area TPA2 may be disposed at an edge of the sub-area SBA. The display pad area DPA, the first touch pad area TPA1, and the second touch pad area TPA2 may be electrically connected to a circuit board 300 using a low-resistance high-reliability material such as an anisotropic conductive film or SAP (Self Assembly Anisotropic Conductive Paste).

The display pad area DPA may include a plurality of display pads DP. The plurality of display pads DP may be connected to a graphics system via the circuit board 300. The plurality of display pads DP may be connected to the circuit board 300 and may receive digital video data therefrom and may supply the digital video data to the display driver 200.

Figure 7:
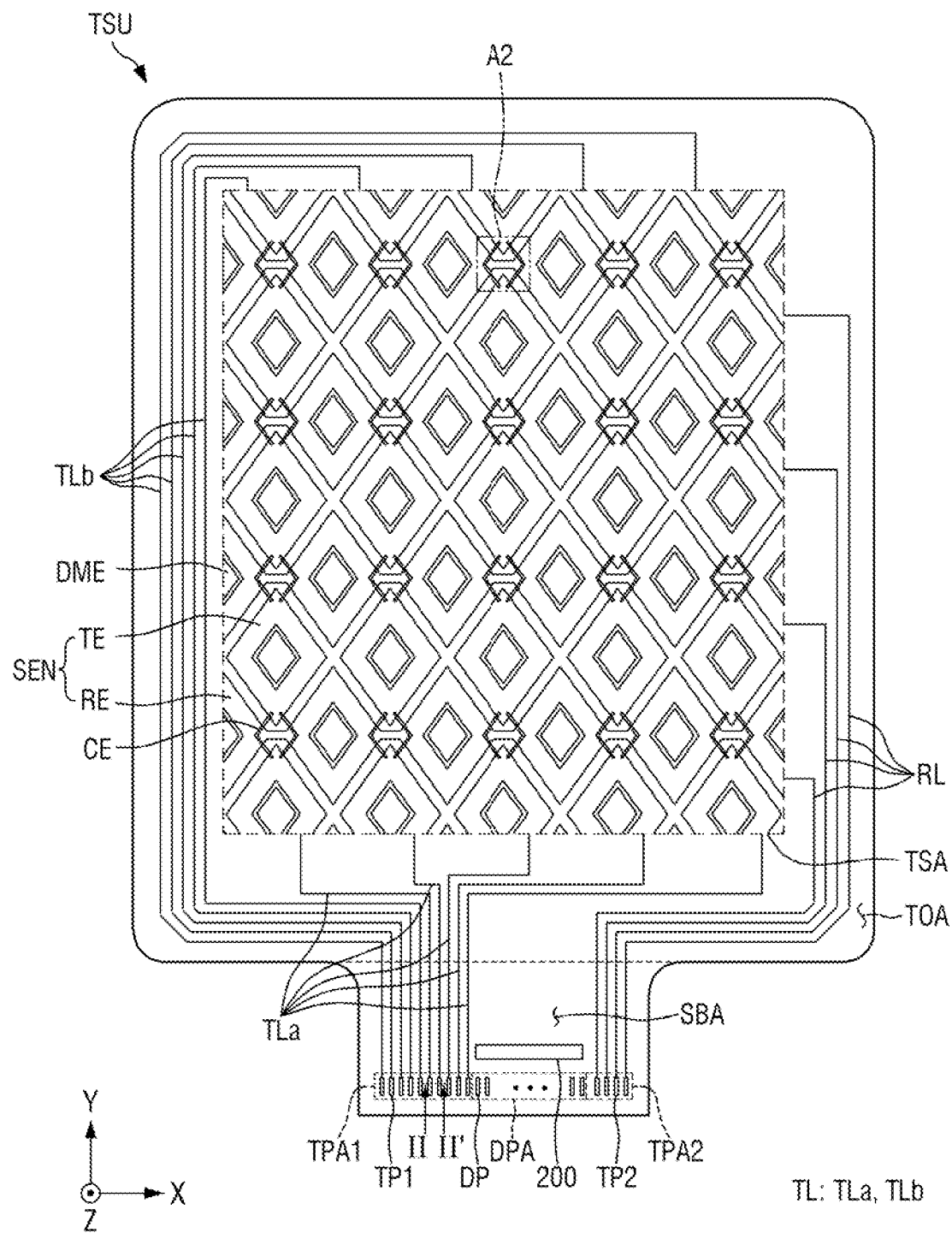
FIG. 7 is a plan view showing a touch sensing, unit of a display device according to an embodiment.

FIG. 7 is a plan view showing a touch sensing unit of a display device according to an embodiment of the present disclosure.

Referring to FIG. 7, a touch sensing unit TSU may include a touch sensor area TSA that detects a user's touch, and a touch surrounding area TOA disposed around the touch sensor area TSA. The touch sensor area TSA may overlap the display area DA of the display unit DU, and the touch surrounding area TOA may overlap the non-display area NDA of the display unit DU.

The touch sensor area TSA may include a plurality of touch electrodes SEN and a plurality of dummy electrodes DME. The plurality of touch electrodes SEN may generate mutual capacitance therebetween or self-capacitances to detect a touch of an object or person. The plurality of touch electrodes SEN may be connected to a touch driver 400 via a touch line TCL. The plurality of touch electrodes SEN may include a plurality of driving electrodes TE and a plurality of sensing electrodes RE. The touch line TCL may include a driving line TL connected to the driving electrode TE and a sensing line RL connected to the sensing electrode RE.

The plurality of driving electrodes TE may be arranged in each of the X-axis direction and the Y-axis direction. The plurality of driving electrodes TE may be spaced apart from each other in each of the X-axis direction and the Y-axis direction. The driving electrodes TE adjacent to each other in the Y-axis direction may be electrically connected to each other via a bridge electrode CE.

The plurality of driving, electrodes TE may be connected to a first touch pad TP1 via the driving line TL The driving line TL may include a lower driving line TLa and an upper driving line TLb. For example, the driving electrodes TE disposed at a bottom of the touch sensor area TSA may be connected to the first touch pad TP1 via the lower driving line TLa. The driving electrodes TE disposed at a top of the touch sensor area TSA may be connected to the first touch pad TP1 via the upper driving line TLb. The lower driving line TLa may extend through a bottom of the touch surrounding area TOA to the first touch pad TP1. The upper driving line TLb may extend to the first touch pad TP1 via a top, a left side, and a bottom of the touch surrounding area TOA, The first touch pad TP1 may be connected to the touch driver 400 via the circuit board 300.

The bridge electrode CE may be bent at least once. For example, the bridge electrode CE may have a bent portion resembling an angle bracket "<" or ">"). However, a planar shape of the bridge electrode CE is not necessarily limited thereto. The driving electrodes TIE adjacent to each other in the Y-axis direction may be connected to each other via a plurality of bridge electrodes CE. Thus, even when one of the bridge electrodes CE is discontinuous, the driving electrodes T E may be reliably connected to each other via the remaining bridge electrodes CE. The driving electrodes TE adjacent to each other may be connected to each other via two bridge electrodes CE. However, the number of the bridge electrodes CE is not necessarily limited thereto.

The bridge electrode CE may be disposed in a layer different from a layer in which the plurality of driving electrodes TE and the plurality of sensing electrodes RE are disposed. The sensing electrodes RE adjacent to each other in the X-axis direction may be electrically connected to each other via a connector disposed in the same layer in which the plurality of driving electrode TE or the plurality of sensing electrode RE are disposed. The driving electrodes TE adjacent to each other in the Y-axis direction may be electrically connected to each other via the bridge electrode CE disposed in a layer different from a layer in which the plurality of driving electrodes TE or the plurality of sensing electrodes RE are disposed. Therefore, even when the bridge electrode CE overlaps the plurality of sensing electrodes RE in a Z-axis direction, the plurality of driving electrodes TE and the plurality of sensing electrodes RE may be insulated from each other, A mutual capacitance may be generated between the driving electrode TE and the sensing electrode RE.

The plurality of sensing electrodes RE may extend in the X-axis direction and may be spaced apart from each other in the Y-axis direction. The plurality of sensing electrodes RE may be arranged in each of the X-axis direction and the Y-axis direction. The sensing electrodes RE adjacent to each other in the X-axis direction may be electrically connected to each other via a connector.

The plurality of sensing electrodes RE may be connected to the second touch pad TP2 via the sensing line RL. For example, the sensing electrodes RE disposed at a right side of the touch sensor area TSA may be connected to the second touch pad TP2 via the sensing line RL. The sensing line RL may extend to the second touch pad TP2 via a right side and a bottom of the touch surrounding area TOA. The second touch pad TP2 may be connected to the touch driver 400 via, the circuit board 300.

Each of a plurality of dummy electrodes DME may be surrounded by the driving electrode TE or the sensing electrode RE, Each of the plurality of dummy electrodes DME may be spaced apart from and insulated from the driving electrode TE or the sensing electrode RE. Thus, the dummy electrode DME may be in an electrically floated state. Optionally, the dummy electrode DME may be omitted.

The display pad area DPA, the first touch pad area TPA1, and the second touch pad area TPA2 may be disposed at an edge of the sub-area SBA. The display pad area DPA, the first touch pad area TPA1, and the second touch pad area TPA2 may be electrically connected to the circuit board 300 using a low-resistance high-reliability material such as an anisotropic conductive film or SAP (Self Assembly Anisotropic Conductive Paste).

The first touch pad area TPA1 may be disposed at one side of the display pad area DPA and may include a plurality of first touch pads TP1. The plurality of first touch pads TP1 may be electrically connected to the touch driver 400 disposed on the circuit board 300. The plurality of first touch pads TP1 may supply a drive signal to the plurality of driving electrodes TE via a plurality of driving lines TL, respectively.

The second touch pad area TPA2 may be disposed at the opposite side of the display pad area DPA and may include a plurality of second touch pads TP2. The plurality of second touch pads TP2 may be electrically connected to the touch driver 400 disposed on the circuit board 300, The touch driver 400 may receive a sensing signal via a plurality of sensing lines RL respectively connected to the plurality of second touch pads TP2, and may sense change in mutual capacitance between the driving electrode TE and the sensing electrode RE.

For example, the touch driver 400 may supply a drive signal to each of the plurality of driving electrodes TE and the plurality of sensing electrodes RE, and may receive a sensing signal front each of the plurality of driving electrodes TE and the plurality of sensing electrodes RE. The touch driver 400 may sense a charge change amount of each of the plurality of driving electrodes TE and the plurality of sensing electrodes, RE based on the sensing signal, FIG. 8 is a cross-sectional view taken along a line II-II' in FIG. 7.

Figure 8:
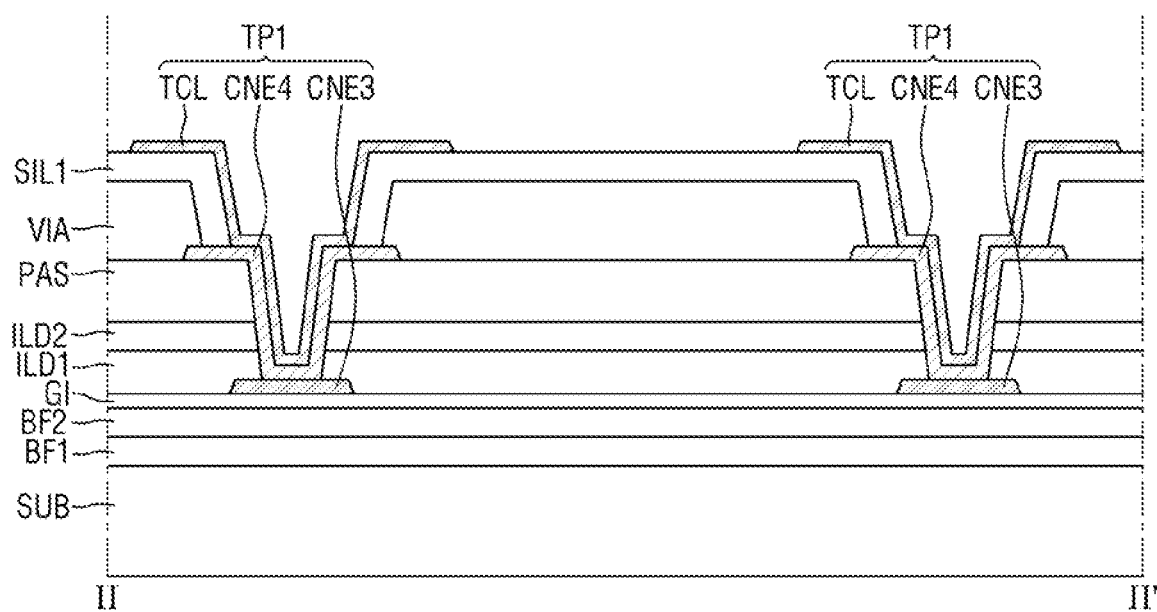
FIG. 8 is a cross-sectional view taken along a line II-II' in FIG. 7.

Referring to FIG. 8, the first touch pad TP1 may include a third connection electrode CNE3, a fourth connection electrode CNE4, and the touch line TCL.

The third connection electrode CNE3 may be disposed on the gate insulating layer GI. The third connection electrode CNE3 and the gate electrode GE of the display area DA may be made of the same material and may constitute the same layer. The third connection electrode CNE3 may contact the fourth connection electrode CNE4.

The fourth connection electrode CNE4 may be disposed on the protective layer PAS. The fourth connection electrode CNE4 and the power line VL and the second connection electrode CNE2 of the display area DA may be made of the same material and may constitute the same layer. The fourth connection electrode CNE4 may be inserted into a contact-hole extending through the first and the second interlayer insulating layers ILD1 and ILD2 and the protective layer PAS and thus may be in contact with the third connection electrode CNE3.

The touch line TCL may be disposed on the first insulating layer SIL1. The touch line TCL may be inserted into a contact-hole extending through the first insulating layer SIL1 and the via layer VIA and thus may contact the fourth connection electrode CNE4.

Each of the display pad DP and the second touch pad TP2 may have the same configuration as that of the first touch pad TP1 shown in FIG. 8. Accordingly, the display pad area DP, the first touch pad TP1, and the second touch pad TP2 may have the same steps and may be electrically connected to the circuit board 300 using a low-resistance and high-reliability material such as an anisotropic conductive film or SAP (Self Assembly Anisotropic Conductive Paste).

Figure 9:
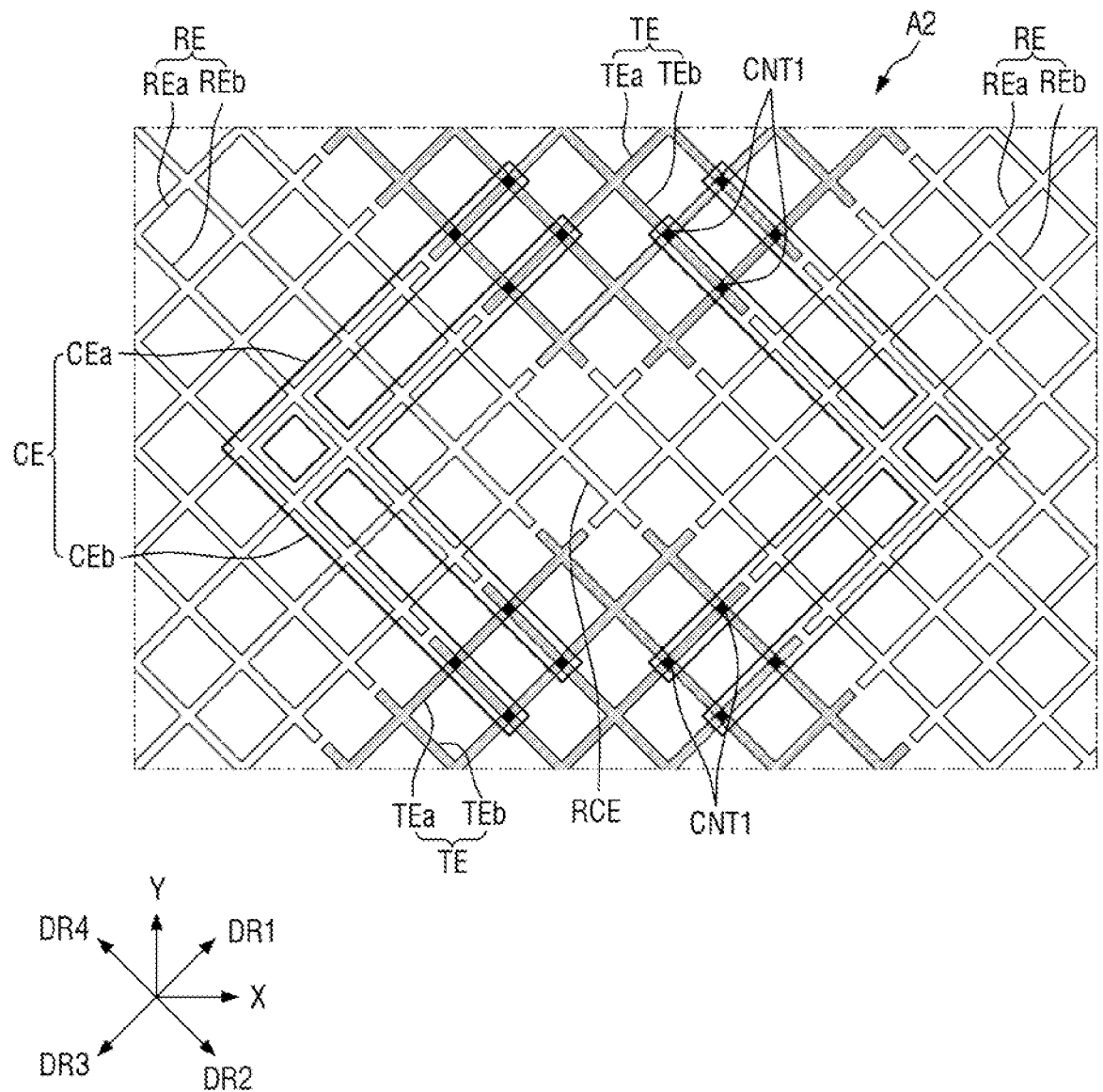
FIG. 9 is an enlarged view showing an area A2 of FIG. 7.

FIG. 9 is an enlarged view showing an area A2 of FIG. 7.

Referring to FIG. 9, the touch sensing unit TSU may include the plurality of touch electrodes SEN and the plurality of dummy electrodes DME. The plurality of driving electrodes TE, the plurality of sensing electrodes RE, and the plurality of dummy electrodes DME may constitute the same layer and may be spaced from each other.

The plurality of driving electrodes TE may be arranged in each of the X-axis direction and the Y-axis direction. The plurality of driving electrodes TE may be spaced apart from each other in each of the X-axis direction and the Y-axis direction. The driving electrodes TE adjacent to each other in the Y-axis direction may be electrically connected to each other via the bridge electrode CE.

The plurality of sensing electrodes RE may extend in the X-axis direction and may be spaced apart from each other in the Y-axis direction. The plurality of sensing electrodes RE may be arranged in each of the X-axis direction and the Y-axis direction. The sensing electrodes RE adjacent to each other in the X-axis direction may be electrically connected to each other via a connector RCE. For example, the connector RCE for connecting the sensing electrodes RE to each other may be disposed within the shortest spacing between the driving electrodes TE adjacent to each other.

The plurality of bridge electrodes CE may be disposed in a layer different from a layer in which the driving electrode TE and the sensing electrode RE are disposed. The bridge electrode CE may include a first portion CEa and a second portion CEb. For example, the first portion CEa of the bridge electrode CE may be connected to the driving electrode TB disposed at one side in the Y-axis direction via a first contact-hole CNT1 and may extend in the third direction DR3. The second portion CEb of the bridge electrode CE may be bent from the first portion C Ea in an area overlapping the sensing electrode RE and may extend in the second direction DR2 and may be connected to the driving electrode TE disposed at the opposite side in the Y-axis direction via the first contact-hole CNT1. Hereinafter, the first direction DR1 refers to a direction between the X-axis direction and the Y-axis direction, the second direction DR2 refers to a direction between the opposite direction to the Y-axis direction and the X-axis direction, and the third direction DR3 refers to the direction opposite to the first direction DR1, and the fourth direction DR4 refers to a direction opposite to the second direction DR2. Accordingly, each of the plurality of bridge electrodes CE may connect the driving electrodes TE adjacent to each other in the Y-axis direction to each other.

Each of the plurality of driving electrodes TE may include a first portion TEa extending in the first direction DR1 and a second portion TEb extending in the second direction DR2. Each of the plurality of sensing electrode REs may include a first portion REa extending in the first direction DR1 and a second portion REb extending in the second direction DR2.

Figure 10:
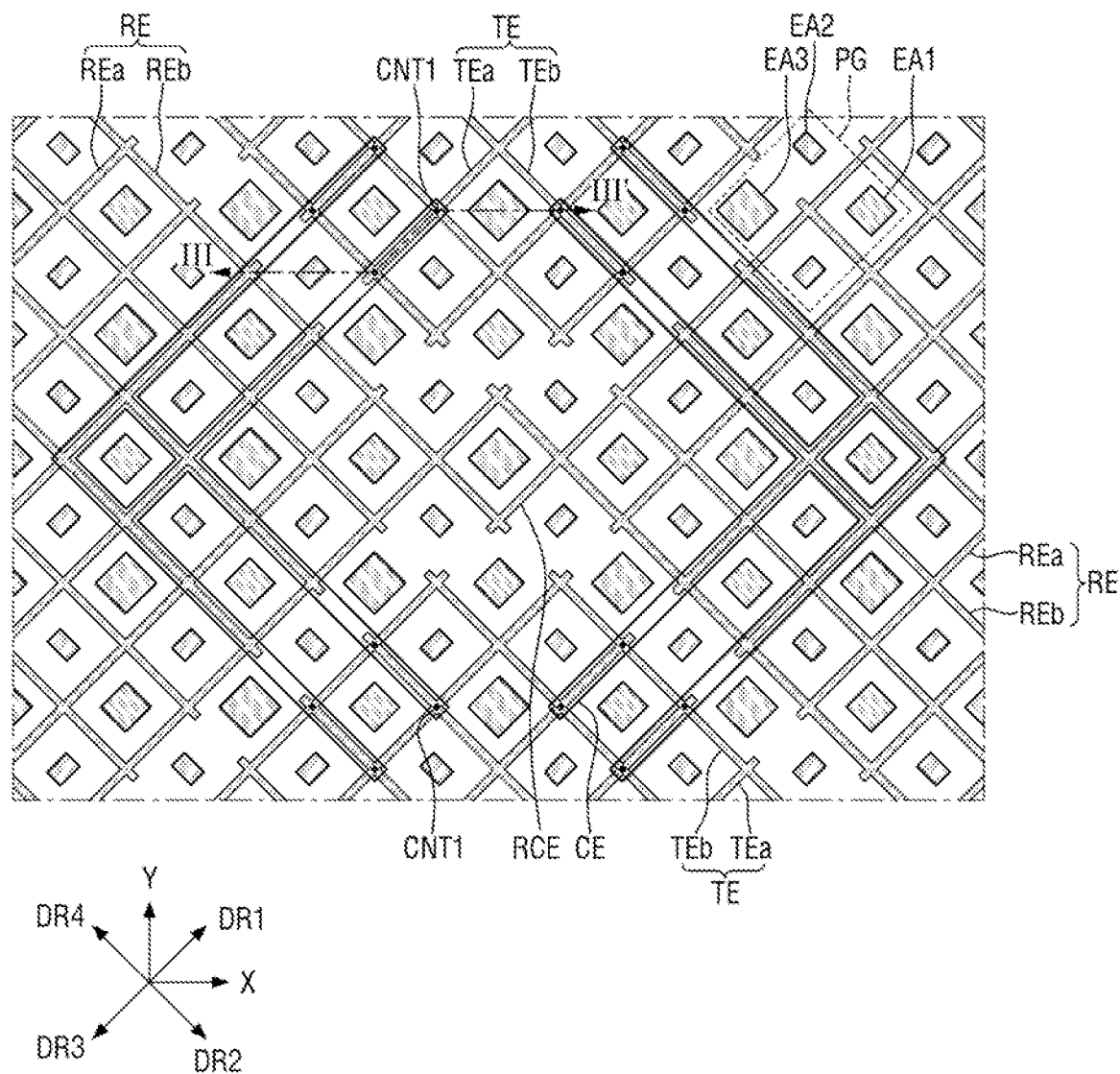
FIG. 10 is an enlarged view showing a portion of a display device according to an embodiment.
Figure 11:
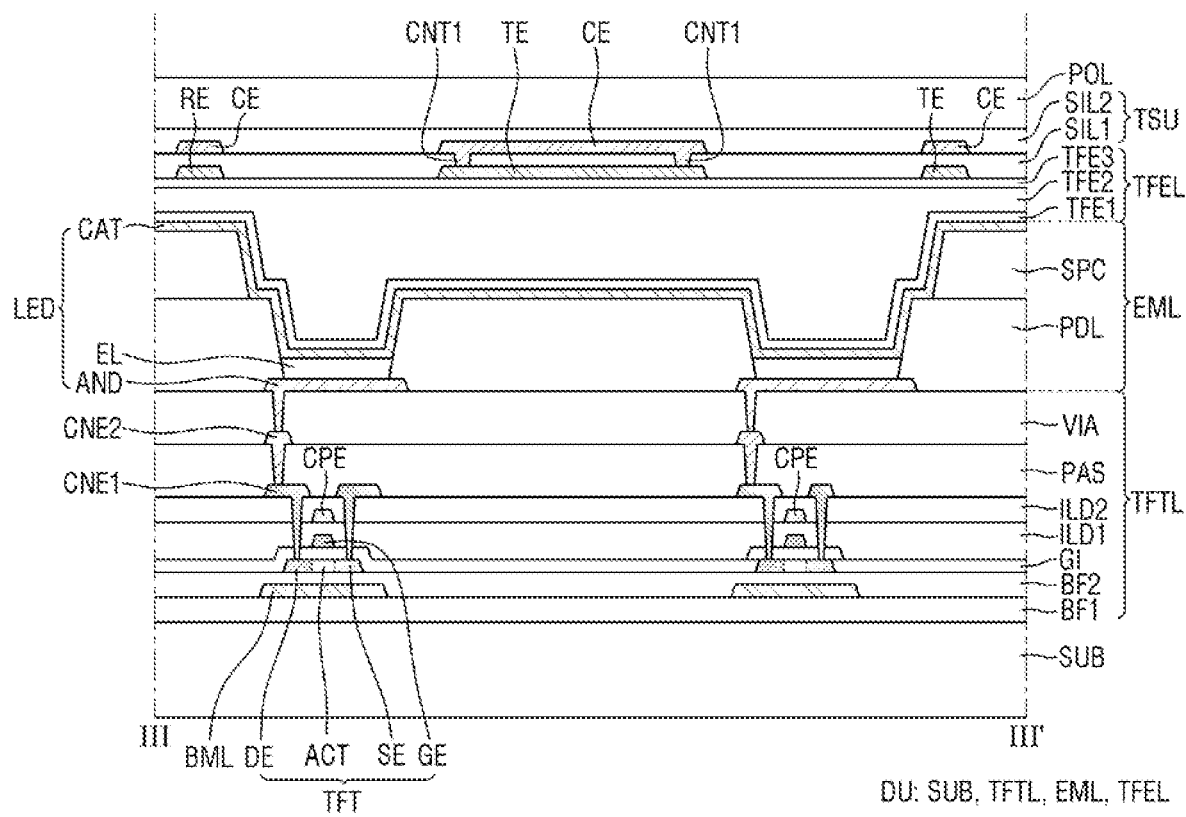
FIG. 11 is a cross-sectional view taken along a line III-III' of FIG. 10.

FIG. 10 is an enlarged view showing a portion of a display device according to an embodiment of the present disclosure, and FIG. 11 is a cross-sectional view taken along a line III-III' of FIG. 10. To the extent that a detailed description of an element has been omitted, it may be assumed that the element is at least similar to corresponding elements that have been described elsewhere in the specification.

Referring to FIG. 10 and FIG. 11, the touch sensing unit TSU may include a plurality of touch electrodes SEN and a plurality of dummy electrodes DME. A plurality of driving electrodes TE, a plurality of sensing electrodes RE, and the plurality of dummy electrodes DME may constitute the same layer and may be spaced from each other.

For example, the plurality of driving electrodes TE, the plurality of sensing electrodes RE, and the plurality of dummy electrodes DMV may be arranged in a mesh structure in a plan view. The plurality of driving electrodes TE, the plurality of sensing electrodes RE, and the plurality of dummy electrodes DME may surround each of first to third light-emitting areas EA1, EA2, and EA3 of a pixel group PG in a plan view. Accordingly, the plurality of driving electrodes TE, the plurality of sensing electrodes RE, and the plurality of dummy electrodes DME might not overlap the first to third light-emitting areas EA1, EA2, and EA3. The plurality of bridge electrodes CE might not overlap the first to third light-emitting areas EA1, EA2, and EA3. Accordingly, the display device 10 may prevent luminance of light emitted from the first to third light-emitting areas EA1, EA2, and EA3 from being reduced due to the touch sensor unit TSU.

Each of the plurality of pixels may include first to third sub-pixels. Each of the first to third sub-pixels may include the first to third light-emitting areas EA1, EA2, and EA3 The first light-emitting area EA1 may emit light of a first color or red light. The second light-emitting area EA2 may emit light of a second color or green light. The third light-emitting area EA3 may emit light of a third color or blue light. The disclosure is not necessarily limited thereto. The first to third light-emitting areas EA1, EA2, and EA3 may have different sizes. For example, a size of the third light-emitting area EA3 may be larger than a size of the first light-emitting area EA1, and a size of the first light-emitting area EA1 may be larger than a size of the second light-emitting area EA2. The disclosure is not necessarily limited thereto. For example, the sizes of the first to third light-emitting areas EA1, EA2, and EA3 may be substantially the same.

One pixel group PG may include one first light-emitting area EA1, two second light-emitting areas EA2, and one third light-emitting areas EA3, and thus may display a white gray level. However, a configuration of the pixel group PG is not necessarily limited thereto. A white gray level may be displayed via a combination of light emitted from one first light-emitting area EA1, light emitted from two second light-emitting areas EA2, and light emitted from one third light-emitting area EA3.

The display panel 100 may include a display unit DU, a touch sensing unit TSU, and a polarization film POL, The display unit DU may include a substrate SUB, a thin-film transistor layer TFTL, a light-emitting element layer EML, and an encapsulation layer TFEL.

The thin-film transistor layer TFTL may include a first buffer layer BF1, a light-blocking layer BML, a second buffer layer BF2, a thin-film transistor TFT, a gate insulating layer GI, a first interlayer insulating layer ILD1, a capacitor electrode CPE, a second interlayer insulating layer ILD2, a first connection electrode CNE1, a protective layer PAS, a second connection electrode CNE2, and a via layer VIA.

The light-emitting element layer EML may be disposed on the thin-film transistor layer TFTL. The light-emitting element layer EML may include a light-emitting element LED, a pixel defining layer PDL, and a spacer SPC. The light-emitting element LED may include a pixel electrode AND, a light-emitting layer EL, and a common electrode CAT.

The encapsulation layer TFEL may be disposed on the common electrode CAT so as to cover a plurality of light-emitting elements LED, The encapsulation layer TFEL may include first to third encapsulation layers TFE1, TFE2, and TFE3. Each of the first and third encapsulation layers TI and TFE3 may include an inorganic film to prevent oxygen or moisture from penetrating into the light-emitting element layer EML The second encapsulation layer TFE2 may include an organic film to protect the light-emitting element layer EMIL from the foreign material such as dusts.

The touch sensing unit TSU may be disposed on the encapsulation layer TFEL. The touch sensing unit TSU may include a touch electrode SEN, a first insulating layer SIL1, a bridge electrode CE, and a second insulating layer SIL2.

The touch electrode SEN may include a driving electrode TE and a sensing electrode RE. The driving electrode TE and the sensing electrode RE may be disposed on the encapsulation layer TFEL. Each of the driving electrode TE and the sensing electrode RE might not overlap the first to third light-emitting areas EA1, EA2, and EA3.

The first insulating layer SIL1 may be disposed on the touch electrode SEN and encapsulation layer TFEL. The first insulating layer SIL1 may have insulating and optical functions. For example, the first insulating layer SIL1 may be embodied as an inorganic film including a silicon nitride layer, a silicon oxynitride layer, a silicon oxide layer, a titanium oxide layer, and/or an aluminum oxide layer.

The bridge electrode CE may be disposed on the first insulating layer SIL1. The bridge electrode CE may be inserted into a plurality of first contact-holes CNT1 defined in the first insulating layer SIL1 and thus may contact the driving electrode TE. The bridge electrode CE may be disposed in a layer different from a layer in which the driving electrode TE and the sensing electrode RE are disposed and may connect the driving electrodes TE adjacent to each other in the Y-axis direction to each other.

The second insulating layer SIL2 may be disposed on the bridge electrode CE and the second insulating layer SIL2 The second insulating layer SIL2 may have insulating and optical functions. The second insulating layer SIL2 may be made of the material exemplified above as the material of the first insulating layer SIL1.

The polarization film POL may be disposed on the touch sensing unit TSU. The polarization film POL may be attached onto the touch sensing unit TSU using an optically clear adhesive (OCA) film, or an optically clear resin (OCR). For example, the polarization film POL may include a linear polarizer and a phase retardation film such as a λ/4 plate (quarter-wave plate). The phase retardation film and the linear polarizer may be sequentially stacked on the touch sensing unit TSU.

Figure 12:
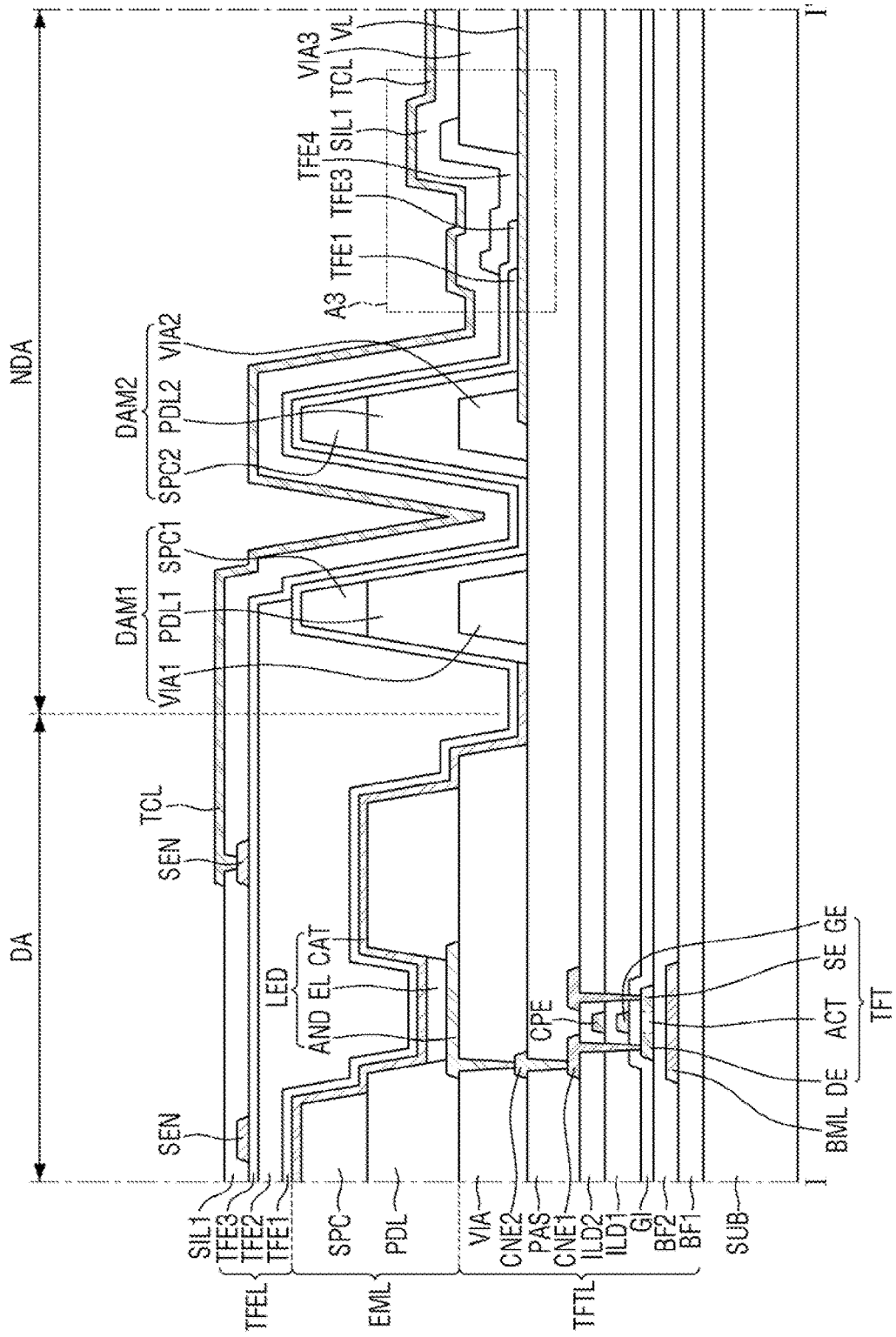
FIG. 12 is a cross-sectional view of an example taken along a line I-I' in FIG. 2.
Figure 13:
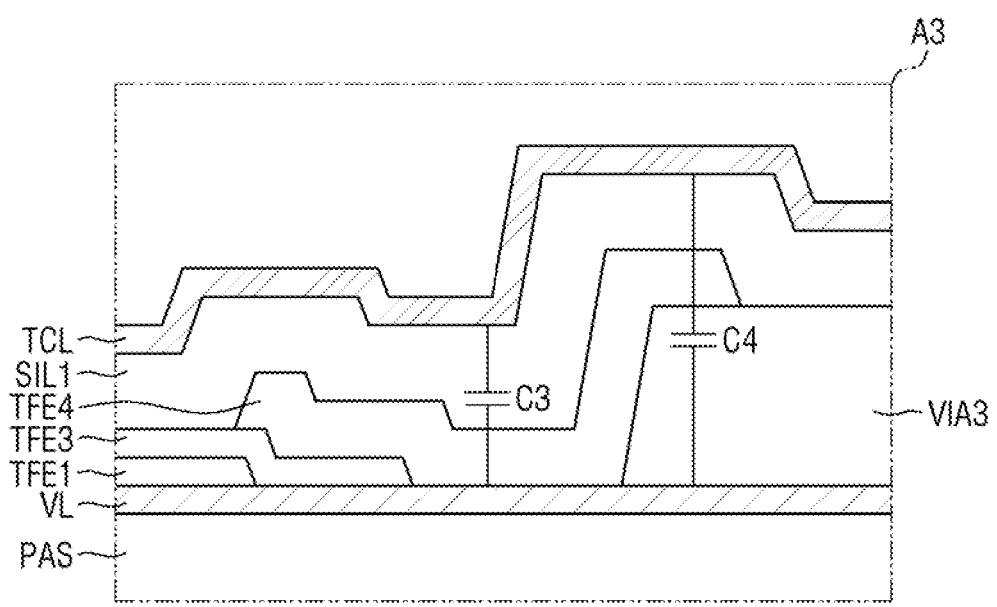
FIG. 13 is an enlarged view showing an area A3 of FIG. 12.

FIG. 12 is a cross-sectional view of an example cut along a line I-I' in FIG. 2, and FIG. 13 is an enlarged view showing an area A3 in FIG. 12. The display device of FIG. 12 and FIG. 13 further includes an outer encapsulation layer TFE4 which is absent in the display device of FIG. 4 and FIG. 5. To the extent that a detailed description of an element has been omitted, it may be assumed that the element is at least similar to corresponding elements that have been described elsewhere in the specification.

Referring to FIG. 12 and FIG. 13, the display unit DU may include the substrate SUB, the thin-film transistor layer TFTL, the light-emitting element layer EML, and the encapsulation layer TFEL.

The thin-film transistor layer TFTL may include the first buffer layer BF, the light-blocking layer BML, the second buffer layer BF2, the thin-film transistor TFT, the gate insulating layer GI, the first interlayer insulating layer ILD1, the capacitor electrode CPE, the second interlayer insulating layer ILD2, the first connection electrode CNE1, the protective layer PAS, the second connection electrode CNE2, the power line VL, and the via layer VIA.

The light-emitting, element layer EMIL may be disposed on the thin-film transistor layer TFTL. The light-emitting element layer EML may include the light-emitting element LED, the pixel defining layer PDL, and the spacer SPC. The light-emitting element LED may include the pixel electrode AND, the light-emitting, layer EL, and the common electrode CAT.

The non-display area NDA may include the first dam DAM1, the second dam DAM2, the outer via VIA3, and the outer encapsulation layer TFE4.

The first dam DAM1 may be disposed in the non-display area NDA so as to surround the display area DA. The first dam DAM1 may include the first via layer VIA1, the first pixel defining layer PDL1, and the first spacer SPC1. The first dam DAM1 may have a predefined vertical dimension, thereby preventing the second encapsulation layer TFE2 from extending to the edge of the non-display area NDA.

The second dam DAM2 may be disposed in the non-display area NDA so as to surround the first dam DAM1. The second dam DAM2 may have the same vertical dimension as that of the first dam DAM1. The disclosure is not necessarily limited thereto. The second dam DAM2 may include the second via layer VIA2, the second pixel defining layer PDL2, and the second spacer SPC2. The second dam DAM2 may have a predefined vertical dimension, thereby preventing the second encapsulation layer TFE2 from extending to the edge of the non-display area NDA.

The outer via VIA3 may be disposed at the edge of the non-display area NDA. The outer via VIA3 and the via layer VIA may be made of the same material and constitute the same layer. The outer via VIA3 may be spaced apart from the second dam DAM2 by a predefined distance. The outer via VIA3 may cover a portion of the power line VL extending along the non-display area NDA.

The encapsulation layer TEEL may be disposed on the common electrode CAT so as to cover the plurality of light-emitting elements LED. The encapsulation layer TFEL may include the first to third encapsulation layers TFE1, TFE2, and TFE3.

The first encapsulation layer TFE1 may be disposed on the common electrode CAT so as to cover the plurality of light-emitting elements LED. The first encapsulation layer TFE1 may be disposed in the display area DA and a portion of the non-display area NDA surrounding the display area DA in a plan view. The first encapsulation layer TFE1 may be disposed on the first dam DAM1 and the second dam DAM2 disposed in the non-display area NDA. The first encapsulation layer TFE1 may cover the top surface and side surfaces of each of the first dam DAM1 and the second dam DAM2 and cover the exposed portion of the power line VL, between the second dam DAM2 and the outer via VIA3. The first encapsulation layer TFE1 includes an inorganic film, thereby preventing oxygen or moisture from penetrating into the light-emitting element layer EML.

The second encapsulation layer TFE2 may be disposed on the first encapsulation layer TFE1. The second encapsulation layer TFE2 may be disposed in the display area DA and a portion of the non-display area NDA surrounding the display area DA in a plan view. The second encapsulation layer TFE2 may planarize a top of the display area DA. Due to the presence of the first dam DAM1 or the second dam DAM2, the second encapsulation layer TFE2 might not extend to the edge of the non-display area NDA. The second encapsulation layer TFE2 may include an organic film, thereby protecting the light-emitting element layer EMIL from the foreign material such as dusts.

The third encapsulation layer TFE3 may be disposed on the first and the second encapsulation layers TFE1 and TFE2 The third encapsulation layer TFE3 may be disposed in the display area DA and a portion of the non-display area NDA surrounding the display area IDA in a plan view. The third encapsulation layer TFE3 may be disposed on the second encapsulation layer TFE2 and in the display area DA and may be disposed on the first encapsulation layer TFE1 and in the non-display area NDA. The third encapsulation, layer TFE3 may cover an edge of the first encapsulation layer TFE1 covering a portion of the power line VL. The third encapsulation layer TFE3 includes an inorganic film, thereby preventing oxygen or moisture from penetrating into the light-emitting element layer EML.

The outer encapsulation layer TFE4 may be disposed on the third encapsulation layer TFE3 and the outer via VIA3. The outer encapsulation layer TFE4 may cover an edge of the third encapsulation layer TFE3, one end of the outer via VIA3 facing toward the display area DA, and an exposed portion of the power line VL between the third encapsulation layer TFE3 and the outer via VIA3. A formation process of the outer encapsulation layer TFE4 may be performed after a formation process of the third encapsulation layer TFE3 has been completed. The outer encapsulation layer TFE4 may include at least one inorganic film or at least one organic film. The outer encapsulation layer TFE4 may include the same material as that of each of the first and the third encapsulation layers TFE1 and TFE3. The disclosure is not necessarily limited thereto, A thickness of the outer encapsulation layer TFE4 may be equal to or greater than a sum of thicknesses of the first and third encapsulation layers TFE1 and TFE3, The outer encapsulation layer TFE4 has a predefined thickness, thereby increasing a distance between the touch line TCL and the power line VL. For example, the thickness of the outer encapsulation layer TFE4 may be in a range of 10,000 angstroms Å or larger. The disclosure is not necessarily limited thereto. In this connection, when the thickness of the outer encapsulation layer TFE4 is 10,000 angstrom A or larger, a ratio between the capacitances of the third capacitor C3 and the fourth capacitor C4 is substantially reduced, thereby preventing electrostatic discharge of the display device 10 and a short-circuit fault between lines.

When a metal foreign material is produced at one end of the outer via VIA3 during the formation of the pixel electrode AND, the outer encapsulation layer TFE4 may cover the metal foreign material, Therefore, the display device 10 includes the outer encapsulation layer TFE4 covering one end of the outer via VIA3, thereby preventing the touch line TCL from being damaged by the metal foreign material that may occur in the process of forming the pixel electrode AND.

The touch sensing unit TSU may be disposed on the display unit DU. The touch sensing unit TSU may include the touch electrode SEN, the first insulating layer SIL1, and the touch line TCL.

The touch electrode SEN may be disposed on the encapsulation layer TFEL. The touch electrode SEN may be a transparent electrode including a transparent conductive material. The touch electrode SEN may transmit light therethrough. The touch electrode SEN may include a driving electrode and a sensing electrode. The touch electrode SEN may be composed of a single layer made of molybdenum (Mo), titanium (Ti), copper (Cu), aluminum (Al), or ITO (indium tin oxide), or a stack structure of aluminum and titanium (Ti/Al/Ti), a stack structure of aluminum and ITO (ITO/Al/ITO), an APC alloy, or a stack structure of the APC alloy and ITO (ITO/APC/ITO).

The first insulating layer SIL1 may be disposed on the touch electrode SEN. The first insulating layer SIL1 may have insulating and optical functions. For example, the first insulating layer SIL1 may be embodied as an inorganic, film including a silicon nitride layer, a silicon oxynitride layer, a silicon oxide layer, a titanium oxide layer, and/or an aluminum oxide layer.

The touch line TCL may be disposed on the first insulating layer SIL1 The touch line TCL may be connected to the touch electrode SEN via the contact-hole received in the first insulating layer SIL1. The touch line TCL may be connected to the touch pad area via the non-display area NDA. Accordingly, the touch line TCL may electrically connect the touch electrode SEN to the touch driver 400.

In FIG. 13, the display device 10 may include the outer encapsulation layer-TFE4 covering one end of the outer via VIA3, thereby increasing the distance between the touch line TCL and the power line VL. A third capacitor C3 may be formed between the touch line TCL and the power line VL and in an area adjacent to one end of the outer via VIA3. Capacitance of the third capacitor (C3 may be inversely proportional to a sum of thicknesses of the outer encapsulation layer TFE4 and the first insulating layer SILL. The capacitance of the third capacitor C3 may decrease as the distance between the touch line TCL and the power line VL increases. A fourth capacitor C4 may be formed between the touch line TCL and the power line VL and in an area overlapping the outer via VIA3. Capacitance of the fourth capacitor C4 may be inversely proportional to a sum of thicknesses of the outer via VIA3, the outer encapsulation layer TFE4, and the first insulating layer SIL1. Therefore, the capacitance of the third capacitor C3 in the display device 10 may be smaller than that in a case where the outer encapsulation layer TFE4 does not cover one end of the outer via VIA3, thereby reducing a ratio of the capacitances of the third capacitor C3 and the fourth capacitor C4. The display device 10 prevents an abrupt change in the capacitance between the touch line TCL and the power line VL, thereby preventing electrostatic discharge of the display device 10 and a short-circuit fault between the lines.

What is claimed is:
1. A display device, comprising:
   a substrate including a display area and a non-display area;
   a thin-film transistor layer comprising a thin-film transistor disposed on the substrate, and a via layer disposed on the thin-film transistor;
   a light-emitting element layer disposed on the thin-film transistor layer, wherein the light-emitting element layer includes a pixel defining layer defining a plurality of light-emitting areas, and a spacer disposed on the pixel defining layer;
   an encapsulation layer disposed on the light-emitting element layer;
   an insulating layer disposed on the encapsulation layer;

a touch line disposed on the insulating layer and extending to the non-display area;

a first dam disposed in the non-display area and at least partially surrounding the display area; and an outer via disposed beyond of the first dam, wherein the outer via is within a same layer as the via layer, wherein the encapsulation layer covers one end of the outer via that faces the display area, wherein the insulating layer covers a top surface of a portion of the outer via that is adjacent to an edge of the encapsulation layer, and wherein the top surface of the outer via comprises a first portion in direct contact with the encapsulation layer and a second portion in direct contact with the insulating layer.

2. The device of claim 1, wherein the first dam comprises:
a first via layer, wherein the via layer is within a same layer as the first via layer;
a first pixel defining layer covering a top surface and side surfaces of the first via layer, wherein the pixel defining layer is within a same layer as the first pixel defining layer; and
a first spacer, wherein the spacer is within a same layer as the first spacer.

3. The device of claim 1, wherein the encapsulation layer comprises:
a first encapsulation layer disposed on the light-emitting element layer;
a second encapsulation layer disposed on the first encapsulation layer; and
a third encapsulation layer disposed on the second encapsulation layer,
wherein the first encapsulation layer covers one end of the outer via.

4. The device of claim 3, wherein the third encapsulation layer covers an edge of the first encapsulation layer and covers a top surface of a portion of the outer via that is adjacent to the edge of the first encapsulation layer.

5. The device of claim 3, wherein the thin-film transistor layer further comprises a power line disposed on the thin-film transistor, wherein a portion of the power line is covered by the outer via.

6. The device of claim 5, wherein the first encapsulation layer directly covers an exposed portion of the power line disposed between the first dam and the outer via.

7. The device of claim 5, further comprising a touch electrode disposed between the third encapsulation layer and the insulating layer, wherein the touch electrode is connected to the touch line through a contact-hole provided in the insulating layer.

8. The device of claim 5, further comprising:
a first capacitor disposed between the touch line and the power line and in an area adjacent to one end of the outer via; and
a second capacitor disposed between the touch line and the power line and in an area overlapping the outer via.

9. The device of claim 8, wherein capacitance of the first capacitor is inversely proportional to a sum of thicknesses of the first encapsulation layer, the third encapsulation layer, and the insulating layer.

10. The device of claim 8, wherein capacitance of the second capacitor is inversely proportional to a sum of thicknesses of the outer via, the first encapsulation layer, the third encapsulation layer, and the insulating layer.

11. A display device, comprising:
a substrate;
a plurality of light-emitting elements disposed on the substrate;
an encapsulation layer disposed over the plurality of light-emitting elements;
an insulating layer disposed over the encapsulation layer;
a touch line disposed over the insulating layer;
a dam structure disposed on the substrate at least partially surrounding the plurality of light-emitting elements; and
a via disposed beyond the dam structure such that the dam structure is disposed between the via and the plurality of light-emitting elements,
wherein the encapsulation layer only partially covers the via, and
wherein the insulating layer at least partially covers the via.

12. The display device of claim 11, further comprising a thin-film transistor disposed on the substrate and a via layer disposed over the thin-film transistor, wherein the via is disposed within the via layer.

13. The display device of claim 11, further including a touch line disposed on the insulating layer.

* * * * *